United States Patent [19]
Shakuda

[11] Patent Number: 6,115,399
[45] Date of Patent: *Sep. 5, 2000

[54] SEMICONDUCTOR LIGHT EMITTING DEVICE

[75] Inventor: Yukio Shakuda, Kyoto, Japan

[73] Assignee: Rohm Co. Ltd., Kyoto, Japan

[*] Notice: This patent is subject to a terminal disclaimer.

[21] Appl. No.: 09/012,790

[22] Filed: Jan. 23, 1998

Related U.S. Application Data

[62] Division of application No. 08/528,308, Sep. 14, 1995, Pat. No. 5,751,752.

[30] Foreign Application Priority Data

| Sep. 14, 1994 | [JP] | Japan | 6-219892 |
| Sep. 28, 1994 | [JP] | Japan | 6-233179 |
| Sep. 28, 1994 | [JP] | Japan | 6-233180 |
| Sep. 29, 1994 | [JP] | Japan | 6-235013 |
| Sep. 29, 1994 | [JP] | Japan | 6-235014 |

[51] Int. Cl.[7] .................................... H01S 3/19
[52] U.S. Cl. .................. 372/45; 372/43; 372/44; 372/46
[58] Field of Search .................. 372/43, 44, 46, 372/45

[56] References Cited

U.S. PATENT DOCUMENTS

| 5,247,533 | 9/1993 | Okazaki et al. | 372/45 |
| 5,578,839 | 11/1996 | Nakamura et al. | 257/96 |
| 5,592,502 | 1/1997 | Matsumoto et al. | 372/45 |
| 5,619,518 | 4/1997 | Horie et al. | 372/46 |
| 5,751,752 | 5/1998 | Shakuda | 372/45 |

FOREIGN PATENT DOCUMENTS

| 1-11375 | 4/1989 | Japan . |
| 1-217986 | 8/1989 | Japan . |
| 4-87378 | 7/1990 | Japan . |
| 4-127595 | 4/1992 | Japan . |

OTHER PUBLICATIONS

Japanese Journal of Applied Physics, vol. 32, No. 1A/B, dated Jan. 15, 1993.
Applied Physics Letters, vol. 64, No. 13, dated Mar. 28, 1994.
IEEE Journal of Quantum Electronics, vol. QE–17, No. 9, dated Sep. 1981.
(3) Nitride mixed crystal (3 pages)—written agreement against Office Action for Japanese Application 06–219892 on which this application is based.
Isamu Akasaki, Advanced Electronics I–1, III–V, Group of Semiconductor Compound (1994); 1st Edition, Baifu–kan, pp. 345–337.

*Primary Examiner*—James W. Davie
*Assistant Examiner*—Benjamin Cushwa
*Attorney, Agent, or Firm*—Burns, Doane, Swecker & Mathis, L.L.P.

[57] ABSTRACT

A semiconductor light emitting device of double hetero junction includes an active layer and clad layers. The clad layers include an n-type layer and p-type layer. The clad layers sandwich the active layer. A band gap energy of the clad layers is larger than that of the active layer. The band gap energy of the n-type clad layer is smaller than of the p-type clad layer.

23 Claims, 9 Drawing Sheets

SEMICONDUCTOR LIGHT EMITTING DEVICE

This application is a divisional application of Ser. No. 08/528,308 filed Sep. 14, 1995 and now U.S. Pat. No. 5,751,752.

BACKGROUND OF THE INVENTION

The invention relates to a semiconductor laser having a double heterodyne structure. More particularly, the invention relates to a semiconductor laser which uses a semiconductor of gallium nitride type compound suitable for emission of blue light, which is capable of reducing operating voltage without reducing the light emitting efficiency.

In the past, blue LED had a fault in putting it to practical use because it has lower luminance than a red LED or a green LED, but in recent years the luminance of the blue LED has increased and is in the spotlight now as a semiconductor of gallium nitride type compound has been in use, making it possible to obtain in p-type semiconductor layer of a low resistance containing Mg as a dopant.

The semiconductor of gallium nitride type compound described here is referred to a semiconductor in which a compound of Ga of group III element and N of group V element or part of Ga of group III element is substituted by other group III element such as Al and In and/or a semiconductor in which part of N of group V element is substituted by other group V element such as P and As.

In a conventional manufacturing method, gallium nitride type LEDs were manufactured in such processes as described below, and a perspective view of LED which uses a semiconductor of completed gallium nitride type compound is shown in FIG. 11.

First, by the organometallic compound vapor phase growth method (hereinafter referred to as MOCVD method), the carrier gas $H_2$ together with trimethyl gallium which is an organometallic compound gas (hereinafter referred to as TMG), ammonia ($NH_3$) and $SiH_4$ and the like are supplied as a dopant to a substrate consisting, for example, of sapphire (single crystal $Al_2O_3$) at low temperature of 400° to 700° C., approximately 0.10 to 0.2 $\mu$m of low temperature buffer layer 2 consisting of n-type GaN layer is formed, and then the same gas is supplied at high temperature of 700° to 1200° C., and approximately 2 to 5 $\mu$m of high temperature buffer layer 3 consisting of n-type GaN of the same composition is formed. The low temperature buffer layer 2 is formed by polycrystalline layer to ease the strain caused by mismatching of the lattice between a substrate 1 and the single crystal layer of semiconductor and then turned into a single crystal by being subjected to 700° to 1200° C., in order to match the lattice by laminating the single crystal of the high temperature buffer layer 3 on that single crystal.

Further, material gas of trimethyl aluminium (hereinafter referred to as TMA) is added to the foregoing gas, a film of an n-type $Al_kGa_{1-k}N$ (0<k<1) layer containing S of n-type dopant is formed, so that approximately 0.1 to 0.3 $\mu$m of an n-type clad layer 4 is formed to form a double heterodyne junction Then, instead of TMA which is the foregoing material gas, trimethyl indium (hereinafter referred to as TMI) is introduced to form approximately 0.05 to 0.1 $\mu$m of an active layer 5 consisting, for example, of $In_yGa_{1-y}N$ (0<y<1), a material whose band gap is smaller than that of the clad layer.

Further, impurity material gas is substituted by $SiH_4$ using the same material gas used for forming the n-type clad layer 4, Mg as a p-type impurity of biscyclopentadiene magnesium (hereinafter referred to as $Cp_2Mg$) or dimethyl zinc (hereinafter referred to as DMZn) for Al is added and introduced into a reaction tube, causing a p-type $Al_kGa_{1-k}N$ layer which is a p-type clad layer 6 to be grown in vapor phase. By this process, a double hetero junction is formed by the n-type clad layer 4, active layer 5, and p-type clad layer 6.

Next, in order to form a contact layer (cap layer) 7, $Cp_2Mg$ or DMZn is supplied as the impurity material gas using the same gas as the foregoing buffer layer 23 to form 0.3 to 2 $\mu$m of the p-type GaN layer.

Afterward, a protective film such as $SiO_2$ and $Si_3N_4$ is provided all over the surface of the grown layer of a semiconductor layer, aniline or electron is irradiated at 400° to 800° C. for approximately 20 to 60 minutes to activate the p-type clad layer 6 and the contact layer (cap layer) 7, after the protective film is removed, resist is applied and patterning is provided to form an electrode on the n-side, part or respective grown semiconductor layers is removed by dry etching so as to expose the buffer layer 3 or the n-type clad layer 4 which is the n-type GaN layer, an electrode 8 on the n-side and an electrode 9 on the p-side are formed by sputtering and the like, and AN LED chip is formed by dicing.

As a conventional semiconductor laser, one that uses a semiconductor of GaAs type compound is known, in which a resonator is formed by a double hetero junction structure with both sides of an active layer being held between clad layers consisting of a material having greater band gap energy and smaller refractive index than the material of such active layer, so that it is possible to obtain the light oscillated in such resonator. Shown in FIG. 12 is an example of a semiconductor laser which uses a semiconductor of GaAs type compound having a refractive index wave guide structure provided with a difference of refractive index by an absorption layer in order to confine the light in the stripe portion of the active layer.

In FIG. 12, the numeral 121 represents a semiconductor substrate consisting, for example, of an n-type GaAs, on which are laminated in order a lower clad layer 124 consisting, for example, of an n-type $Al_\alpha Ga_{1-\alpha}As$ (0.35≦α≦0.75), an active layer 125 consisting, for example, of $Al_\beta Ga_{1-\beta}As$ (0<β≦0.3) of non-doping type or an n-type or a p-type, a first upper clad layer 126a consisting of a p-type $Al_\alpha Ga_{1-\alpha}As$, a current laminating 120 consisting of an n-type GaAs, a second upper clad layer 126b consisting of a p-type $Al_\alpha Ga_{1-\alpha}As$, and a contact layer (cap layer) 127 consisting of a p-type GaAs, and the p-side electrode 128 and the n-side electrode 129 are respectively provided on the upper surface and the lower surface in order to form a chip of a semiconductor laser. In this structure, the current limiting layer 120 consisting of the n-type GaAs restricts the injection current to the stripe-like active area of width W, by absorbing the light generated by the active layer, a difference of refractive index is provided in the inside and the outside of the stripe. Therefore, the semiconductor laser of the present invention is used as a semiconductor laser of a red or infrared ray refractive index wave guide structure wherein the light is confined in transverse direction and the wave of stripe-like active area of width W is directed stably.

In the semiconductor laser of such structure, a blue light radiating semiconductor laser using a semiconductor of gallium nitride type compound is also requested.

In a conventional semiconductor of gallium nitride type compound, the light emitting efficiency of the light emitting element of double hetero junction is high but the operating voltage thereof is high. If a material of small band gap energy, that is, a material of small Al composition rate k of $Al_kGa_{1-k}N$ is used for the n-type clad layer and the p-type clad layer in order to lower the operating voltage, the operating voltage is lowered but the electron outflow from the active layer to the p-type clad layer increases, while the light emitting efficiency is lowered.

In the case where a semiconductor laser is to be composed by using a semiconductor of gallium nitride type compound, by providing a structure wherein an active layer is interposed between both sides by a clad layer consisting of a material having greater band gap energy and smaller refractive index than such active layer so as to confine the light in the active layer for oscillation, it can be considered to use $In_yGa_{1-y}N$ (1<y<1, where y=0.1 for example) as the active layer and $Al_kGa_{1-k}N$ (0<k<1, where k=0.2 for example) as the clad layer of both sides.

In a semiconductor laser which uses a conventional semiconductor of arsenic gallium type compound, specific resistance of $Al_\alpha Ga_{1-\alpha}As$ as the clad layer is approximately 100Ω·cm and there occurs no problem of increased operating voltage or heat generation even if such clad layer is used as one requiring approximately 1 to 2 μm, but if a semiconductor of gallium nitride type compound is used, the specific resistance of $Al_kGa_{1-k}N$ (k=0.2 for example) is approximately 1000Ω·cm when the carrier density of $10^{17}cm^{-3}$, which is approximately 8 times as compared with the specific resistance of GaN of the same carrier density, thereby increasing the operating voltage as well as the power consumption in addition to the problem of heat generation.

Further, in a light emitting element of a semiconductor which uses a conventional semiconductor of gallium nitride type compound wherein the GaN layer is used as the contact layer 7 in which the p-side electrode is to be made, due to such reasons that the GaN layer is affected by variations of the surface level and that there is a large energy gap between the metallic conduction band such as the, alloy of Au or Au and Zn used as electrode and the valence band of GaN, and the contact resistance between the electrode metal and the cap layer does not stabilize as a result, so that the contact resistance becomes large and the operating voltage also rises. These problems results from a basic problem that it is not possible to increase the carrier density of the p-type layer, and further, in a type of semiconductor laser with the current injection area being restricted to stripe-like shape in which the contact area of the electrode is formed into a stripe-like shape, and the problem becomes more conspicuous.

Furthermore, as described above, the light emitting element of a semiconductor which uses a conventional semiconductor of gallium nitride type compound is composed by laminating on a sapphire substrate a semiconductor layer of gallium nitride type compound by means of a low temperature buffer layer consisting of GaN and a high temperature buffer layer, the lattice constant 4.758 Å of the sapphire substrate is largely different from the lattice constant 3.189 Å of GaN, the interatomic bonding strength of GaN is strong although it is weaker than that of AlGaN group, so that a crystal defect or transition is likely to occur due to temperature shock. In case a crystal defect or transistion occurs in the low temperature buffer layer, the crystal defect or transition progresses to the semiconductor layer formed thereon, thereby deteriorating the light emitting characteristic and reducing the life.

In addition, in the light emitting element of a semiconductor which uses a conventional semiconductor of gallium nitride type compound, as described above, electric current flows between the p-side electrode 8 provided on the contact layer 7 and the n-side electrode 9 provided on the high temperature buffer layer 3 which is an n-type layer due to the voltage applied therebetween, and the electric current flowing to the n-side electrode 9 has high carrier density of the buffer layers 2 and 3, so that the electric current flows throughout the buffer layers 3 and 2. On the other hand, because the buffer layer, the low temperature buffer layer 2 in particular is formed on a substrate consisting, for example, of sapphire that has a different lattice constant from that of a semiconductor of gallium nitride type compound, crystal defects or transition are likely to occur. When electric current flows into the buffer layer where crystal defects or transition take place, crystal defects or transition increase further due to the heat generated by the electric current, such crystal defects or transition progress to the semiconductor which contributes to the emission of light, thereby lowering the light emitting characteristic, reliability or the life.

SUMMARY OF THE INVENTION

An object of the present invention is to provide a light emitting device (hereinafter referred to as a light emitting element) of a semiconductor using a highly characteristic semiconductor of gallium nitride type compound which prevents increase in series resistance, that is, an increase in operating voltage resulting from the use of a semiconductor of gallium nitride type compound as described above and restricts further the occurrence of crystal defects or transition.

A first object of the present invention is to provide a light emitting element of a semiconductor of double hetero structure in which the light emitting efficiency does not lower with the operating voltage being low.

A second object of the present invention is to provide a semiconductor laser of high light emitting efficiency which demonstrates sufficiently the effect of confining the light in an active layer by a clad layer even in a semiconductor laser which uses a semiconductor of gallium nitride type compound and is suitable for emission of blue light, lowers the series resistance of the semiconductor layer, and operates on low operating voltage.

A third object of the present invention is to p provide a light emitting element of a semiconductor in which the contact resistance between the n-side electrode and the contact layer is small and a large output can be obtained from low operating voltage.

A fourth object of the present invention is to provide a light emitting element of a semiconductor of high characteristic or efficiency and long life which restricts occurrence of crystal defects or transition by reducing further the strain of the buffer layer on the surface of a substrate consisting of sapphire and the like and prevents the progress of crystal defects or transition toward the semiconductor layer which contributes to emission of light.

The light emitting element of a semiconductor which realizes the first object of the present invention has at least a sandwich structure consisting of an n-type clad layer, an active layer, and a p-type clad layer, is light emitting element of a semiconductor of double hetero junction type which is formed by a material, band gap energy of said active layer being smaller than the band gap energy of both the foregoing clad layers, and both the foregoing clad layers being selected so that the band gap energy of the foregoing n-type clad layer becomes smaller than the band gap energy of the foregoing p-type clad layer.

It is preferable that the foregoing n-type clad layer consists of an n-type $Al_xGa_{1-x}N$ ($0 \leq x \leq 0.5$), that the foregoing active layer consists of $In_yGa_{1-y}N$ ($0 \leq y \leq 1$), that the foregoing n-type clad layer consists of a p-type $Al_zGa_{1-z}N$ ($0 < z \leq 1$), where $2x \leq z$.

It is preferable that a buffer layer consisting of GaN is provided between one of the foregoing clad layers and the substrate in order that it is possible to relieve the strain of the clad layer, prevent occurrence of crystal defects or transition in the clad layer, and lower the resistance of the semiconductor layer.

In accordance with the light emitting element of a semiconductor which realizes the first object of the present invention, because a material having smaller band gap energy than that of the p-type clad layer is used for the n-type clad layer, injection of electron into the active layer from the n-type clad layer is carried out easily at low voltage. On the other hand, because a material having a large band gap energy is used for the p-type clad layer in the same way as in the past, escape of electron from the active layer to the p-type clad layer is less, contributing to recombination of electron and positive hole in the active layer. Because the positive hole has a greater effective mass than the electron, there is less escape of the electron toward the n-type clad layer side of the positive hole injected into the active layer even if the band gap energy of the n-type clad layer is small. Therefore, the electron contributes to recombination in the active layer without wasting the positive hole, so that it is possible to lower the operating voltage by the amount of the band gap energy of the n-type clad layer is reduced, and the light of approximately the same luminance is emitted.

Because the band gap energy of the n-type clad layer can be made small is approximately three times the electron having effective mass of the positive hole, it is possible to reduce the band gap energy of the n-type clad layer to approximately half the difference of the band gap energy between the p-type clad layer and the active layer, if the $Al_kGa_{1-k}N$ material is used, it is possible to reduce the ratio k of Al to less than half the ratio of Al of the p-type clad layer, and it is possible to lower the operating voltage by 5 to 10%.

A light emitting element which realizes the second object of the present invention is a semiconductor laser of double hetero junction structure which has an active layer, an n-type layer and p-type layer consisting of a material having greater band gap energy and smaller refractive index that the active layer, and the foregoing active layer being held between the foregoing n-type layer and the p-type layer, wherein the foregoing n-type layer and the p-type layer respectively consist of at least two layers, a low refractive index layer consisting of material with small refractive index is provided on the foregoing active layer side of the n-type layer and p-type layer, and a low resistance layer having smaller electric resistance than the foregoing low refractive index layer is provided in other portion of an electric current path of the n-type layer and p-type layer.

It is preferable that the thickness of the foregoing low refractive index layer is 10 to 50% with respect to the thickness of the foregoing n-type layer or p-type layer, so that it is possible to confine the light effectively in the active layer to certain extent and to lower the operating voltage.

Similar to the foregoing, it is preferable that the thickness of the foregoing refractive index layer is 0.1 to 0.3 $\mu$m because it is possible to confine the light effectively in the active layer to certain extent and to lower the operating voltage.

In order to obtain a semicondcutor laser which emits blue light of excellent light emitting characteristic, it is preferable that the foregoing active layer consists of $Al_mGa_nIn_{1-m-n}N$ ($0 \leq m < 1$, $0 < n < 1$, $0 < m+n < 1$), the foregoing low refractive index layer consists of $Al_rGa_sIn_{1-r-s}N$ ($0 \leq r < 1$, $0 < s < 1$, $m+n < r+s \leq 1$, $m < r$), and the foregoing low resistance layer consists of $Al_tGa_uIn_{1-t-u}N$ ($0 \leq t < 1$, $0 < u \leq 1$, $0 < t+u < 1$, $m < t < r$, $m+n < t+u \leq r+s$).

It is preferable that m=0 in the material composition of the foregoing active layer, that r+s=1 in the material composition of the foregoing low refractive index layer, and that t=o and u=1 in the material composition of the foregoing low resistance layer because it is possible to obtain a semiconductor laser which is of more simple structure, has excellent light emitting characteristic, and emits blue light.

In accordance with the semiconductor laser which realizes the second object of the present invention, since the band gap energy for sandwiching the active layer is large, a low refractive index layer is provided on the respective active layer side of the n-type layer and p-type layer consisting of a material with small refractive index, and a low resistance layer of small electric resistance is provided in an electric current path, effect for confining the light into the active layer is achieved by reflecting the light efficiently on the low refractive index layer, with respect to an increase in specific resistance due to the low refractive index layer, it is possible to reduce sufficiently the operating voltage by other low resistance layer without being influenced excessively by forming the low refractive index layer on a thin layer of approximately 0.1 to 0.3 $\mu$m for example.

As a result, it is possible to prevent heat generation due to excessive resistance loss, improve the light emitting efficiency, and extend the life.

The light emitting element of a semiconductor which realizes the third object of the present invention is a light emitting element of a semiconductor in which a semiconductor layer of gallium nitride type compound having a light emitting portion containing at least an n-type layer and p-type layer is laminated on a substrate and an n-side electrode an p-side electrode to be connected respectively to the foregoing n-type layer and p-type layer are provided, and on at least the electrode side surface of the semiconductor layer to be provided with the foregoing p-side electrode are provided a p-type $In_aGa_{1-a}N$ ($0 < a < 1$) or p-type GaSa or p-type GaP or p-type $In_bGa_{1-b}As$ ($0 < b < 1$) or $In_bGa_{1-b}P$ ($0 < b < 1$).

That the composition ratio of In of the foregoing $In_aGa_{1-a}N$ is $0 < a \leq 0.5$ is preferable, so that it is possible to lower the contact resistance without emerging the problem of lattice mismatching.

In accordance with the light emitting element of a semiconductor which realizes the third object of the present invention, because $In_aGa_{1-a}N$ or GaAs or GaP or $In_bGa_{1-b}As$ or $In_bGa_{1-b}P$ is used on the surface of the contact layer to be provided with the p-side electrode, the contact resistance of the semiconductor layer and the electrode becomes small. In other words, because these semiconductor layer such as $In_aGa_{1-a}N$ has smaller band gap energy (forbidden band width) that GaN and is difficult to be oxidized, it becomes difficult for flowing electric current (contact resistance) due to the trapping of electron or positive hole according to the surface level is reduced. Further, a semiconductor layer such as $In_aGa_{1-a}N$ has smaller band gap energy (forbidden band width) as compared to GaN and the energy gap between the energy level of the metallic conduction band as an electrode and the valence band of the semiconductor layer is small, permitting the positive hole to flow easily. There is a gap occurring in the energy level of the valence band between $In_aGa_{1-a}N$ layer and GaN layer but the energy gap $E_v$ between the electrode metal and GaN layer is divided into the energy gap $E_{v1}$ between the metal and $In_aGa_{1-a}N$ layer and the energy gap $E_{v2}$ between $In_aGa_{1-a}N$ layer and GaN layer, so that the apparent contact resistance becomes small since the positive hole or electron which has climbed over the small energy gap $E_{v1}$ should climb over the small energy gap $E_{v2}$ further whole it should not climb over the large energy gap $E_v$ directly.

With respect to the GaAs pr GaP, because the band gap energy (forbidden band width) is small and difficult to be oxidized in the same manner as $In_aGa_{1-a}N$, the surface level is difficult to occur and the band gap energy is smaller than that of $In_aGa_{1-a}N$, so that the contact resistance becomes small further.

As in the case of the foregoing $In_aGa_{1-a}N$, In of $In_bGa_{1-b}As$ or $In_bGa_{1-b}P$ plays a role of reducing the band gap energy (forbidden band width) further and acts to reduce the contact resistance further. In this case, lattice matching deviates largely from that of $In_aGa_{1-a}N$ but the effect of reduction of the band gap energy is larger. In addition, it is possible to increase the p-type carrier density further.

The light emitting element of a semiconductor which realizes the fourth object of the present invention is a light emitting element of a semiconductor in which a semiconductor layer of gallium nitride type compound having a luminous portion containing at least an n-type layer and a p-type layer is laminated on a substrate by means of a buffer layer and at least the foregoing substrate side of the foregoing buffer layer is consisted of a semiconductor layer of gallium nitride type compound containing at least one kind of element selected from a group consisting of P and As.

It is preferable that the foregoing buffer layer has a low temperature buffer layer formed at least at low temperature and that the low temperature buffer layer is a semiconductor layer consisting of $In_cGa_{1-c}N$ (0<c<1) or $In_dAl_eGa_nIn_{1-d-e}N$ (0<d<1, 0<e<1, 0<d+e<1).

It is preferable that the foregoing buffer layer has a low temperature buffer layer formed at least at low temperature and that the low temperature buffer layer is a semiconductor layer consisting of $GaN_uP_{1-u}$ (0<u<1) or $GaN_vAs_{1-v}$ (0<v<1) because it is possible to reduce the straining of the buffer layer.

In accordance with this light emitting element of a semiconductor, because In, P or As is contained in the buffer layer consisting of semiconductor of gallium nitride type compound on a sapphire substrate, the buffer layer becomes soft and occurrence of crystal defects or transition becomes difficult. In other words, when a part of Ga of GaN becomes $In_cGa_{1-c}N$ (0<c<1) which is substituted by In, In is heavier than Ga and is easily cut in a crystal, the strain is easily relieved, making it difficult for crystal defects and the like to occur. In addition, it becomes easy to form a polycrystalline film at low temperature by containing In, and it is possible to relieve the strain further by forming a buffer layer at low temperature. These phenomena apply in the same manner to $In_dAl_eGa_{1-d-e}N$ (0<d<1, 0<e<1, 0<d+e<1) of which part of Ga is substituted by Al.

Further, when part of N of GaN becomes $GaN_uP_{1-u}$ (0<u<1) or $GaN_vAs_{1-v}$ (0<v<1) of which part of N of GaN is substituted by P or As, P or As becomes heavier than N and easily moves in a crystal. Therefore, according to the same reason that part of the foregoing Ga is substituted by In, the strain of the buffer layer is relieved, so that it becomes difficult for crystal defects or transition to occur.

Crystal defects or transition occurred in a buffer layer where the strain is likely to occur most in contact with sapphire substrate and the like progress toward a semiconductor layer which contributes to the light emitting portion, and the strain of the buffer layer is relieved and the occurrence of crystal defects or transition of the buffer layer is restricted, so that the occurrence of crystal defects or transition of a semiconductor layer which contributes to the light emitting portion is restricted, the light emitting characteristic is improved, and the life and also improved.

Other light emitting element of a semiconductor which achieves the forth object of the present invention consists of a semiconductor layer where the electric current is difficult to flow at least on the foregoing substrate side of the buffer layer.

That the foregoing buffer layer is a semiconductor layer of gallium nitride type compound containing at least one kind of element selected from a group consisting of In, P and As is preferable because softness is provided and it is possible to relieve the strain and to make it difficult for crystal defects or transition to occur.

Because at least the foregoing substrate side of the foregoing buffer layer is consisted of a semiconductor layer of high resistance, it is possible to make it difficult for the electric current to flow.

Even in the case of a conductive type semiconductor layer which is different from a conductive type semiconductor layer in which at lest the foregoing substrate side of the foregoing buffer layer is laminated directly on the buffer layer, it is possible to make it difficult for the electric current to flow to the substrate side of the buffer layer.

Because the foregoing buffer layer is formed at high temperature on a p-type low temperature buffer layer formed at low temperature on the foregoing substrate surface and such low temperature buffer layer, consisted of a high temperature buffer layer in which at least the surface side is made an n-type, on such high temperature buffer layer are sequentially formed an n-type cald layer, an active layer, a p-type clad layer, and a p-type contact layer in that order, the p-side electrode is formed on such p-type contact layer, the n-type electrode is formed on the foregoing n-type clad layer exposed by etching or on the high temperature buffer layer, it is possible to obtain a light emitting element of a semiconductor of hetero junction structure in which it is difficult for the electric current to flow toward the buffer layer on the substrate side.

Because the foregoing buffer layer consists of GaN, the foregoing n-type and p-type clad layer consists of $Al_kGa_{1-k}N$ (0<k<1) respectively, the foregoing active layer consists of $Ga_yIn_{1-y}N$ (0<y≦1), and foregoing p-type contact layer consists of GaN, it is possible to obtain a simply structured light emitting element of a semiconductor of double hetero junction structure.

In accordance with the light emitting element of a semiconductor of the present invention, because the semiconductor layer contacting at least the substrate of the semiconductor layer of gallium nitride type compound to be laminated on the substrate is made a semiconductor layer where it is difficult for the electric current to flow, there will be no further increase in crystal defects or transition caused by the electric current which occur due to the strain based on the difference of the lattice constant with respect to the substrate, and further the progress is restricted of crystal defects or transition toward the semiconductor layer contributing to the light emitting portion, so that it is possible to obtain a semiconductor layer of less crystal defects or transition.

In other words, when the electric current flows to a semiconductor layer where crystal defects or transition are occurring, a resistance loss occurs and heat is generated in a portion where crysal defects or transition are occurring, crystal defects or transition increase further, and the vicious cycle is repeated. On the other hand, because crystal defects or transition of the semiconductor of a portion contributing to radiation results from the progress of crystal defects or transition occurred in the semiconductor of a portion contributing to radiation results from the progress of crystal defects or transition occurred in the semiconductor layer contacting the substrate, by restricting the occurrence of crystal defects or transition in the semiconductor layer contacting the substrate, it is possible to restrict the occurrence of crystal defects or transition in the semiconductor layer which positively contributes to the emission of light. As a result, a light emitting element of a semiconductor of excellent light emitting characteristic, high reliability, and long life can be obtained.

DETAILED DESCRIPTION

Referring now in detail to the drawings, the light emitting of a semiconductor of the present invention will be described.

EXAMPLE 1

Figure 1:
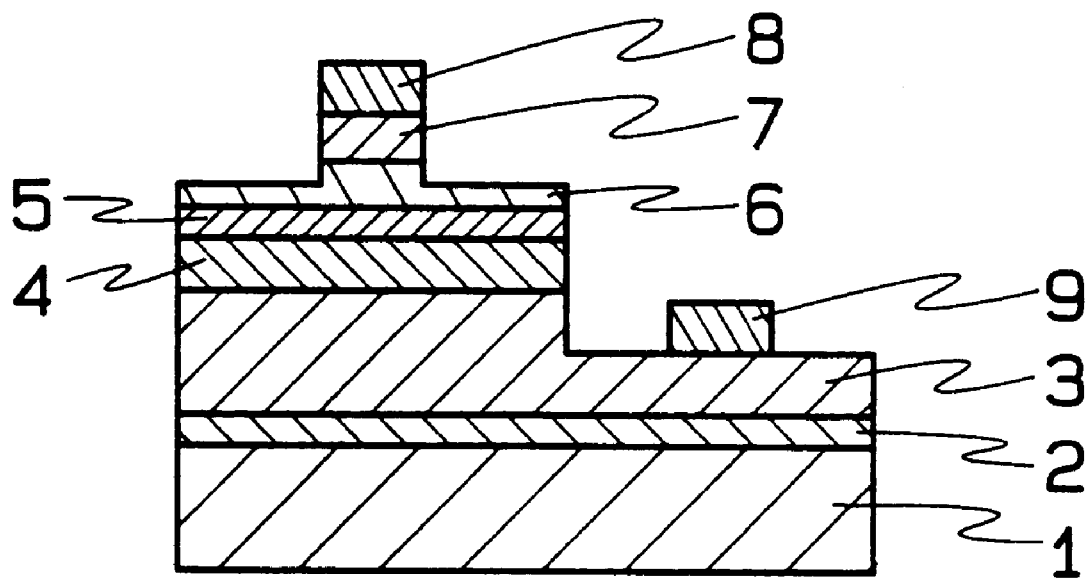
FIG. 1 is an explanatory drawing illustrating a section of an example 1 of the light emitting element of a semiconductor of the present invention.
Figure 2A:
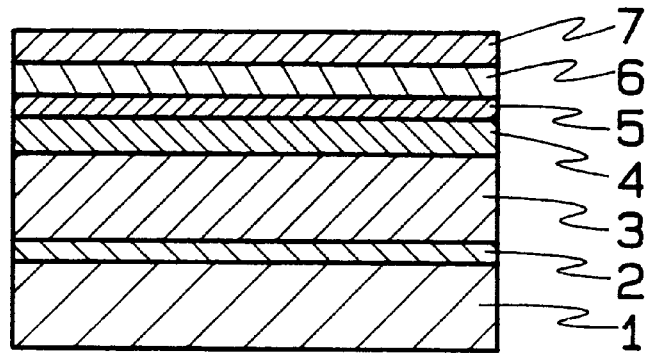
FIGS. 2(a) through 2(c) are explanatory drawings illustrating manufacturing processes of FIG. 1.
Figure 2B:
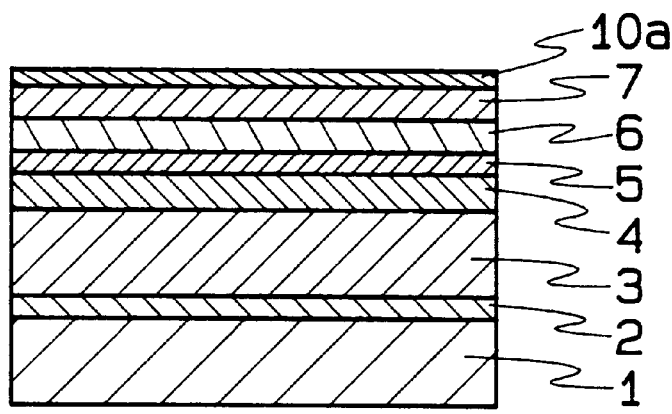
Figure 2C:
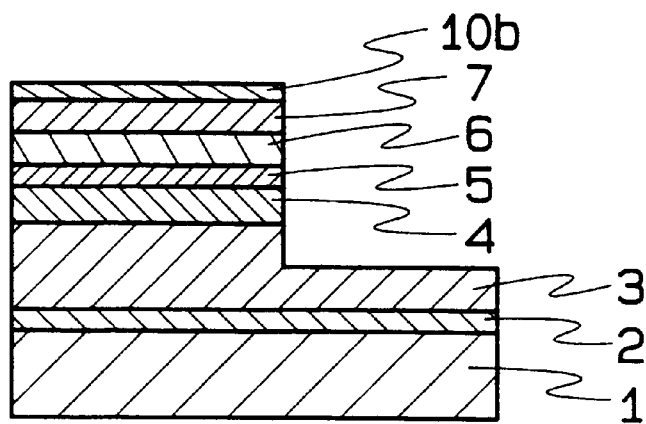
Figure 3:
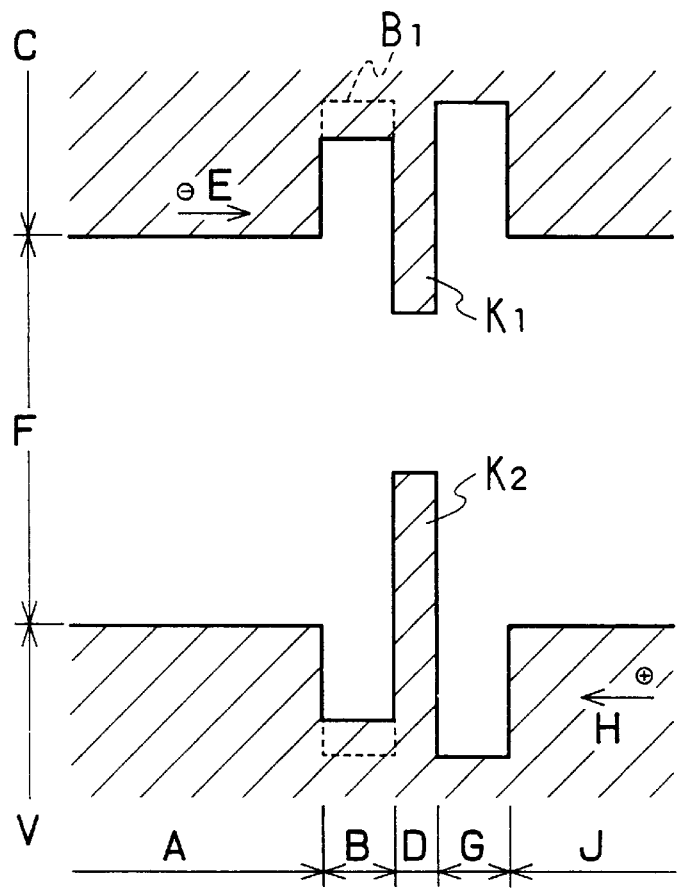
FIG. 3 is an energy band drawing mainly illustrating a forbidden band of a clad layer and an active layer of an example 1 of the light emitting element of a semiconductor of the present invention.

FIG. 1 is an explanatory drawing of a section of a laser chip of a mesa-type shape semiconductor of an example 1 of the light emitting element of a semiconductor of the present invention, FIGS. 2(a) through 2(c) are the manufacturing process drawing thereof, and FIG. 3 is a schematic illustration showing the energy band drawing mainly of the forbidden band of an n-type clad layer, an active layer, and a p-type clad layer of the light emitting element of a semiconductor of the example 1.

In FIG. 1, the numeral 1 indicates a substrate such as sapphire (single crystal of $Al_2O_3$) consisting of an n-type GaN, wherein a low temperature buffer layer 2 of approximately 0.01 to 0.2 $\mu$m, a high temperature buffer layer 3 of approximately 2 to 3 $\mu$m consisting of an n-type GaN, an n-type clad layer 4 of approximately 0.1 to 0.3 $\mu$m consisting of an n-type material such as $Al_xGa_{1-x}N$ ($0 \leq x \leq 0.5$, where x=0.07 for example) which has a smaller band gap energy (forbidden band width) than a p-type clad layer, an active layer 5 of approximately 0.05 to 0.1 $\mu$m consisting of non-doping or an n-type or a p-type material such as $In_yGa_{1-y}N$ ($0 \leq y \leq 1$) which has a smaller band gap energy and larger refractive index than both clad layers, a p-type clad layer 6 of approximately 0.1 to 0.3 $\mu$m consisting of a p-type $Al_zGa_{1-z}N$ ($0<z<1$, $2x<z$, where z=0.15 for example), and a contact layer (cap layer) 7 of approximately 0.3 to 2 $\mu$m consisting of a p-type GaN are laminated in order, a p-side electrode 8 consisting of a metal such as Au is formed on the contact layer 7, an n-side electrode 9 consisting of a metal such as Al is formed on the high temperature buffer layer 3 wherein a part of the laminated semiconductor layer is removed and exposed by etching, and a current stripe is formed, so that part of the contact layer 7 and the p-type clad layer is etched and turned into a mesa-type shape, and a chip of a semiconductor laser is formed.

In the light emitting element of a semiconductor of the present invention, as shown in an example of this semiconductor laser, the band gap energy of the n-type clad layer 4 smaller than the band gap energy of the p-type clad layer 6, and both clad layers 4 and 6 are formed by a material having a greater band gap energy than that of the active layer 5.

In order to recombine the electron and the positive hole efficiently and to improve the light emitting efficiency, a light emitting element of a semiconductor of double junction structure for sandwiching the active layer 5 consisting of a material having a small band gap energy by clad layers consisting of material having a large band gap energy, is used for a semiconductor laser or an LED of high luminance. When a material having a large band gap energy is used for the clad layer, effect of confining the electron and the positive hole increases and contributes to the emission of light without waste but the operating voltage increases, and in practice, a material having a band gap energy which can ignore to a certain degree the leakage of the electron and the positive hole from the active layer, is selected. However, the operating voltage increases as compared with that of the pn junction. In the present invention, it is so designed that it is possible to lower the operating voltage while maintaining this degree with which the electron and the positive hole can be ignored. In other words, the effective mass of the positive hole is as approximately three times large as the effective mass of electron, and the leakage from the positive hole is smaller than that from the electron even if the band gap energy is small. For this reason, by using for the n-type clad layer a material having a band gap energy smaller than that of the p-type clad layer, it is possible to inject the electron into the active layer at low voltage and prevent the leakage of the positive hole from the active layer.

Referring now to FIG. 3 which illustrates a schematic diagram showing the energy band drawing of the foregoing semiconductor laser of FIG. 1, the action of the present invention will be described. In FIG. 3, the letter V represents the valence band, F the forbidden band, and C the energy band of the conduction band respectively, and the letters A represents the high temperature buffer layer consisting of an n-type GaN, B the n-type clad layer 4 consisting of n-type GaN, B the n-type clad layer 4 consisting of an n-type $Al_{0.07}Ga_{0.93}N$, D the active layer 5 consisting of $In_yGa_{1-y}N$, G the p-type clad layer 6 consisting of $Al_{0.15}Ga_{0.85}N$, and J the contact layer 7 consisting of a p-type GaN respectively of the ranges of the energy bands thereof.

In the semiconductor laser of this example, as shown in FIG. 3, the band gap energy of the n-type clad layer indicated by B is formed to be smaller than the band gap energy of the p-type clad layer indicated by G. The band gap energy indicated by the broken line $B_1$ illustrates the case of the band gap energy which is the same as the p-type clad layer in a conventional structure.

With this structure, when voltage is applied between the p-side electrode 8 and the n-side electrode 9, the electron E flows from the n-type GaN (high temperature buffer layer A) to the p-side, and then into the conduction band $K_1$ of the active layer. In this case, because the band gap energy of the n-type clad layer is low, the electron E is likely to flow into the conduction band $K_1$ of the active layer, so that the electron is supplied to the active layer even with low voltage. The electron E flowed into the conduction band $K_1$ of the active layer is pulled by the p-side electrode, but is confied in the active layer because the band gap energy of the p-type clad layer is large. On the other hand, the positive hole flows from the p-type GaN (contact layer J) to the n-side, and then into the valence band $K_2$ of the active layer. The positive hole H flowed into the valence band $K_2$ of the active layer is pulled by the n-side electrode, but the effective mass of the positive hole H is as approximately three times large as the effective mass of electron, the positive hole cannot climb over the band gap energy even if the band gap energy of the n-type clad layer B is low, and is confined effectively in the valence band of the active layer. As a result, recombination of the electron and the positive hole is carried out in the active layer efficiently, and high light emitting efficiency can be obtained.

As described above, in accordance with the present invention, because each semiconductor layer is selected so that the band gap energy of the n-type clad layer is made smaller than that of the p-type clad layer, it is possible to inject the electron into the active layer with low voltage and improve the light emitting efficiency without increasing the reactive current. The amount that the band gap energy of the n-type clad layer is smaller than that of the p-type clad layer is determined by the band gap energy of the active layer, and the amount may be as low as ⅓ to ½ in the case of the p-type layer by the difference of the band gap energy of the active layer.

In order to reduce the band gap energy by using a semiconductor of gallium nitride type compound consisting of a general formula $Al_pGa_{1-p-q}N$ ($0≦p<1$, $0<q≦1$, $0<p+q≦1$), it is possible to obtain a small band gap energy by making p small, that is, by making the composition ratio of Al small, or by making p+q small, that is, by making the composition ratio of In large. For this reason, by adjusting the composition ratio of Al and In so as to make the band gap energy of the clad layer larger than that of the active layer, and so as to make the band gap energy of the r-type clad layer smaller than that of the p-type clad layer, it is possible to obtain a semiconductor layer of a desired band gap energy.

Because the example shown in FIG. 1 refers to a semiconductor, it is necessary to confine the light in the active layer and oscillate it, so that the refractive index of the clad layer is made smaller than that of the active layer, but it is not always necessary to do so in the case of LED. However, if the composition ratio of Al is made large by the foregoing composition ratio, the refractive index is made small.

Next, by referring to FIGS. 2(a) through 2(c), the manufacturing method of the semiconductor laser shown in FIG. 1 will be described.

First, as shown in FIG. 2(a), on a substrate 1 consisting of sapphire and the like is grown by the MOCVD method, approximately 0.01 to 0.2 μm of a low temperature buffer layer 2 consisting, for example, of a semiconductor of gallium nitride type compound such as the n-type GaN, and approximately 2 to 5 μm of a high temperature bufrer layer 3 consisting of the n-type GaN of the same composition is formed at 700° to 1200° C.

Next, TMI is supplied further, and approximately 0.1 to 0.3 μm of an n-type clad layer 4 consisting, for example, of the n-type $Al_xGa_{1-x}N$ ($0≦x≦0.5$, where x=0.07 for example) is formed. Afterward, TMI is supplied instead of TMA and an active layer 5 consisting of a non-doping type or an n-type or p-type $In_yGa_{1-y}N$ ($0≦y≦1$, where y=0.06 for example) is caused to grow to a thickness of approximately 0.05 to 0.1 μm. Then, by using the same material gas as the material gas which is used to form the n-type clad layer 4, TMA is supplied to a reaction tube at the flow rate of 20 to 100 sccm which is approximately twice the case of the n-type clad layer 4 so as to form approximately 0.1 to 0.3 μm of the p-type $Al_zGa_{1-z}N$ ($0<z≦1$, $2x≦z$, where z=0.15 for example) which is the p-type clad layer 6. Further, the same material gas used for forming the buffer layer 3 is supplied so as to form approximately 0.3 to 2 μm of a contact layer 7 consisting of the p-type GaN.

In order to form the foregoing buffer layer 3 or clad layer 4 into an n-type clad layer, Si, Ge, Tc is mixed into a reaction oven as the impurity material gas such as $SiH_4$, $GeH_4$, and $TeH_4$, and in order to form the clad layer 6 or the contact layer 7 into a p-type clad layer, Mg or Zn is mixed into the material gas as the organometallic gas of $Cp_2Mg$ or DMZn. However, in the case of the n-type, even if the impurity is not mixed, N is easily evaporated during film forming and is turned into the n-type naturally, and therefore such nature may be utilized.

Afterwards, a protective film 10a such as $SiO_2$ or $Si_3N_4$ is provided over the entire surface of the grown layer of a semiconductor layer (refer to FIG. 2(b)), annealed for approximately 20 to 60 minutes at 400 to 800° C., and the p-type clad layer 6 and the cap layer 7 which are the p-type layer.

When annealing is completed, as shown in FIG. 2(C), a mask such as a resist film 10b is provided and the laminated semiconductor layer is etched until the n-type clad layer 4 or the n-type high temperature buffer layer 3 is exposed. This etching is carried out by the reactive ion etching under the atmosphere of a mixed gas of $Cl_2$ and $BCl_3$ for example.

Then, a metallic film such as Au and Al is formed by sputtering, on the surface of the laminated compound of semiconductor layer is formed the p-side electrode 8 to be electrically connected to the p-type layer, on the surface of the exposed high temperature buffer layer 3 is formed the n-side electrode 9 to be electrically connected to the n-type layer, and part of the contact layer 7 and the p-type clad layer 6 are etched into mesa-type shape layers (refer to FIG. 1).

Next, each chip is diced, and thus semiconductor laser chips are formed.

In this example, the semiconductor laser of mesa-type shape current stripe structure is described, but the present invention can also be applied to a semiconductor laser of various structures such as the flush type current limiting layer or the light emitting element of semiconductor which uses a semiconductor of gallium nitride type compound such as LED of double hetero junction structure.

In accordance with the light emitting element of a semiconductor of this example, because the semiconductor material is selected so that it is possible to make the band gap energy of the n-type clad layer smaller than the band gap energy of the p-type clad layer, reactive current is less, and, it is possible to emit the light of high luminance with low operating voltage and to obtain a light emitting element of semiconductor having high light emitting efficiency.

EXAMPLE 2

Figure 4:
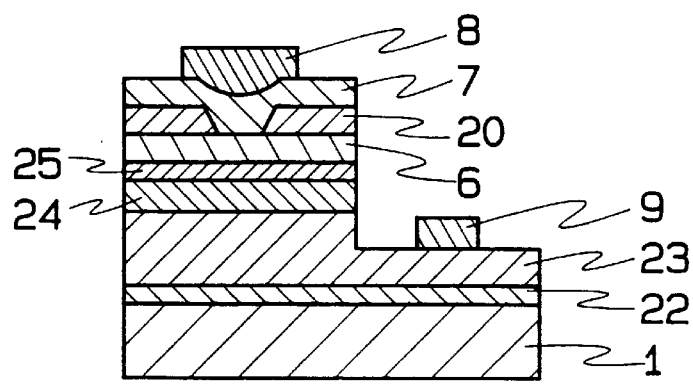
FIG. 4 is an explanatory drawing of a section illustrating an example 2 of the semiconductor laser of the present invention.
Figure 5A:
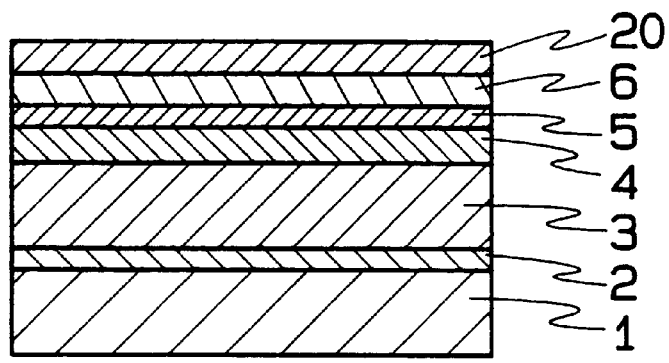
FIGS. 5(a) through 5(c) are explanatory drawings illustrating processes of the manufacturing method of an example 2 of the semiconductor laser of the present invention.
Figure 5B:
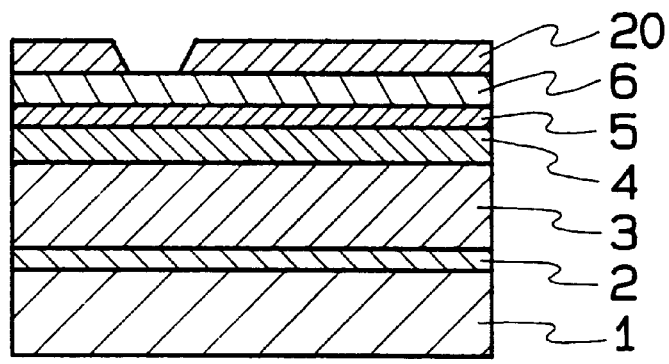
Figure 5C:
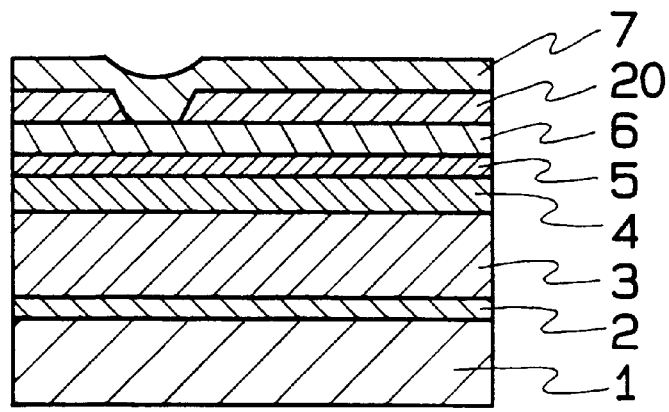

FIG. 4 is an explanatory drawing of a section of the chip of a semiconductor laser which is the other example of the light emitting element of the semiconductor of the present invention, and FIGS. 5(a) through 5(c) are an explanatory drawing of a section of the process of the manufacturing method thereof.

As shown in FIG. 4, in the semiconductor laser of this example, a low buffer layer 22 of approximately 0.01 to 0.2 $\mu$m which is a lower resistance layer with small electric resistance consisting of an n-type $Al_tGa_{1-t-u}N$ ($0 \leq t < 1$, $0 < u \leq 1$, $0 < t+u \leq 1$) and the like provided on a substrate 1 such as sapphire (single crystal of $Al_2O_3$), a high temperature buffer layer 23 of approximately 2 to 5 $\mu$m, an n-type clad layer 24 of approximately 0.1 to 0.3 in which is low refractive index layer consisting of an n-type $Al_rGa_sIn_{1-r-s}N$ ($0 \leq t < 1$, $0 < s < 1$, $0 < r+s < 1$) and having the refractive index smaller than that of the foregoing buffer layers 22 and 23, an active layer 25 of approximately 0.05 to 0.1 $\mu$m consisting of $Al_mGa_nIn_{1-m-n}N$ ($0 < m < r$, $0 < m+n < r+s$) of a non-doping type or an n-type or a p-type and having a smaller band gap energy and a larger refractive index than the n-type clad layer 24 (the ratio n of Al is small and the ratio 1-m-n of In is large), a p-type clad layer 26 of approximately 0.1 to 0.3 $\mu$m which is a low refractive index layer of the same composition as the n-type clad layer 24, a current limiting layer 20 consisting of GaN and the like formed with a stripe groove, and a cotnact layer consisting of the p-type $Al_tGa_uIn_{1-t-u}N$ ($0 \leq t < 1$, $0 < u \leq 1$, $0 < t+u \leq 1$) of approximately 3 to 2 $\mu$m which is a low refractive index layer of the same composition as the buffer layers 22 and 23 are laminated in order, the p-side electrode 8 is provided on the surface of the contact layer 7, the n-side electrode 9 on the high temperature buffer layer 23 which is exposed by etching a part of the laminated semiconductor layer, and a chip of the semiconductor laser of this example is formed.

Figure 6:
FIG. 6 is a drawing illustrating the relation of the light emitting efficiency with respect to the thickness of a low refractive index layer.

In the semiconductor laser of this example, the n-type layer and the p-type layer which hold the active layer 25 is separated into the buffer layers 22 and 23 which are the low resistance layer respectively, the n-type clad layer 24 which is the low refractive index layer, the p-type clad layer 6 which is the low refractive index layer, and the contact layer 27 which is the low resistance layer, and the low refractive index layer is formed into a minimum thickness necessary to confine the light into the active layer. In order to inspect the influence on the low refractive index layer by the thickness, the inventor of the present invention inspected the light emitting efficiency in a manner as shown in an example of concrete structure to be described layer, namely, on the buffer layer 23 is formed approximately 3 $\mu$m of the n-type GaN, on the n-type and p-type clad layers 24 and 26 are formed $Al_{0.3}Ga_{0.7}N$, and on the contact layer 27 is formed approximately 2 $\mu$m of the p-type GaN respectively, the thickness of the clad layers 24 and 26 are changed differently from 0 to 0.4 $\mu$m (the thickness of the buffer layer 3 and the contact layer 27 is also changed every time so as to keep the total thickness of the clad layers 24 and 26 constant), and thus the light emitting efficiency is inspected. Results of the inspection is shown in FIG. 6. As is apparent from FIG. 6, it is necessary that the thickness of the low refractive index layer is formed to be 0.05 to 0.3 $\mu$m, and preferably to be approximately 0.1 to 0.2 $\mu$m, and is formed to be 10 to 50% with respect to the entire thickness of the n-type layer or the p-type layer, and preferably to be approximately 10 to 30%.

In case where a semiconductor of gallium nitride type compound is expressed as the general formula of $Al_pGa_qIn_{1-p-q}N$, in order to make the refractive index small in a semiconductor of gallium nitride type compound, it is necessary to make the composition ratio of Al large and to make the composition ratio of In small, and when the composition ratio of Al is made large, the resistance is increased and the resistance loss results. Therefore, in this example, a low refractive index layer (the n-type clad layer 24 and the p-type clad layer 26) is provided for confining the light into the semiconductor portion adjacent to the active layer 25 of the n-type layer (the buffer layers 22 and 23, and the n-type clad laeyr 24) which hold the active layer 25 therebetween, and other portion is made a low resistance where the loss of resistance does not occur.

In order to make the specific resistance small in the semiconductor of gallium nitride type compound expressed as the foregoing general formula of $Al_pGa_qIn_{1-p-q}$, the composition ratio of Al is to be simply made small. In this case, it is necessary for the n-type layer and the p-type layer which hold the active layer therebetween to be provided with the function as the clad layer to confine the light into the active layer, it is preferable that even the low resistance layer (the buffer layers 22 and 23 and the contact layer 27) is formed by a material which has smaller refractive index and larger band gap energy than the active layer 25. In order to achieve this object, by making the composition ratio of In large in the active layer 25 and by making such composition ratio small in the n-type layer and the p-type layer, it is possible to obtain a layer which is of low resistance and has larger band gap energy and smaller refractive index than the active layer 25.

In this example, the composition ratios of the n-type buffer layers 22 and 23 and the contact layer 27 are made to be the same, and the composition ratios of the n-type clad layer 24 and p-type clad layer 26 are made to be the same, but respective composition ratios may not always have to be the same, and the low refractive index layer (the n-type clad layer 24 and p-type clad layer 26) may have smaller refractive index and larger band gap energy than the active layer 25 or the low resistance layer (the buffer layers 22 and 23 and the contact layer 27), and the low resistance layer may be of a material having smaller specific resistance than the low refractive index layer.

The low temperature buffer layer 22 is made to be a low resistance layer in this example, but it is not necessary to make the low temperature buffer layer to be an electric current path if it is possible to provide the n-side electrode 9 on the high temperature buffer layer 23, so that the low temperature buffer layer 22 may be made to be a high resistance layer or the p-type layer. In this case, it is preferable that electric current is not flowed to the low temperature buffer layer where crystal defects or transition are likely to occur, thereby making it possible to prevent an increase of crystal defects or transition.

Further, in the boundary between the low resistance layer and the low refractive index layer, the composition may not be changed sharply but may be changed gradually. Causing the composition to change gradually is effective to restrict the strain generating in the interface due to sudden change in composition. In addition, a second clad layer which is a low resistance layer similar to the contact layer 27 may be provided between the p-type clad layer 26 and the contact layer 27, so that the high temperature buffer layer 23 accomplishes the function of the clad layer of low resistance layer.

Next, the manufacturing method of the semiconductor laser of this example will be described by a definite example thereof. First, as shown in FIG. 5(a), a substrate 1 consisting of sapphire and the like is installed in a reaction tube, and in the same manner as the example 1, 10 slm of the carrier gas $H_2$, 100 sccm of the reactant gas TMG, and 10 slm of $NH_3$ are introduced to grow in vapor phase at 400° to 700° C. by means of the organometallic vapor phase growth method (hereinafter referred to as the MOCVD method), and a low temperature buffer layer 22 which is a polycrystalline film consisting of GaN of approximately 0.01 to 0.2 μm is formed. Then, by raising the temperature to 700° to 1200° C. and allwoing to stand for approximately 5 to 15 minutes, polycrystal line of the low temperature 5 to 15 minutes, polycrystal line of the low temperature buffer layer 2 is made into a single crystal, by introducing thereon the same material gas as the foregoing and causing it to react in vapor phase at high temperature of 700° to 1200° C., a high temperature buffer layer 23 consisting of single crystal of GaN is formed to 2 to 5 μm thick.

Further, by mixing TMA at the flow rate of 10 to 200 sccm and causing it to react in vapor phase, an n-type clad layer 24 consisting of $Al_{0.2}Ga_{0.8}N$ is formed to 0.1 to 0.3 μm thick.

Next, the dopant $SiH_4$ is stopped and in place of TMA, TMI is supplied at the flow rate of 10 to 200 sccm so as to form approximately 0.05 to 0.1 μm of a non-doping active layer 5 consisting of $In_{0.1}Ga_{0.9}N$, further the material gas of the same composition as that of the n-type clad laeyr 24 is supplied, the impurity material gas is replaced by $SiH_4$ and $Cp_2Mg$ or DMZn is introduced at the flow rate of 10 to 1000 sccm so as to form the p-type clad layer 6 consisting of $Al_{0.2}Ga_{0.8}N$ to 0.1 to 0.3 μm thick, and then, the n-type GaN layer is formed to approximately 0.1 to 0.5 μm thick so as to form a current limiting layer 20 by supplying TMG, $NH_3$, and $SiH_4$.

Afterward, the furnace temperature is lowered to approximately the room temperature, a substrate with semiconductor layer laminated thereon is taken out from the MOCVD device, and as shown in FIG. 5(b), a stripe groove is formed by etching by lithographic process, and the current limiting layer 20 is formed.

Afterwards, as shown in FIG. 5(c), the substrate is put into the MOCVD device again with the temperature set at 700° to 1200° C., TMG and $NH_3$ as the reactant gas and $Cp_2Mg$ or DMZn as the dopant are supplied, and approximately 2 to 3 μm of a contact layer 27 consisting of GaN is formed.

Afterwards, a protective film such as $SiO_2$ and $Si_3N_4$ is provided on the entire surface of a semiconductor layer and annealed for approximately 20 to 60 minutes at 400° to 8000° C. so as to activate the p-type clad layer 26 and the contact layer 27.

Next, in order to form the n-side electrode, a mask is formed by a resist film and the like and part of a semiconductor layer laminated under atmosphere of $Cl_2$ gas is provided with reactive ion etching, a high temperature buffer layer 23 which is an n-type layer is caused to be exposed, a p-side electrode 8 consisting of Au and Au—Zn and the like is formed on the contact layer 27, an n-side electrode 9 consisting of Au and Au—Zn and the like is formed on the contact layer 27, an n-side electrode 9 consisting of Al and Au—Gc and the like is formed on the high temperature buffer layer 23, and a chip of a semicondcutor laser is formed by dicing (refer to FIG. 4).

In this example, the semiconductor laser is a semiconductive laser of refractive index wave guide type provided with the current limiting layer 20, but it is also the same in the case of a gain wave guide stripe type semiconductor laser. Further, it is the semiconductor laser which uses a semiconductor of gallium nitride type compound whose general formula is expressed as $Al_pGa_qIn_{1-p-q}N$, and though it is not so remarkable as the semiconductor of gallium nigride type compound, it will be effective by application of the present invention even in the case of a semiconductor of other compound such as the semiconductor of arsenic gallium type compound.

In accordance with a semiconductor laser of the example 2, because the n-type layer and the p-type layer for holding the active layer therbetween are respectively formed by at least a low refractive index layer and a low resistance layer, confinement of the light into the active layer is carried out by the low refractive index layer, electric resistance of the portion composing other electric current path becomes small due to the low resistance layer, so that it is possible to lower the operating voltage. As a result, it is possible to obtain a semiconductor laser which operates with low operating voltage and has high light emitting efficiency.

EXAMPLE 3

Figure 7:
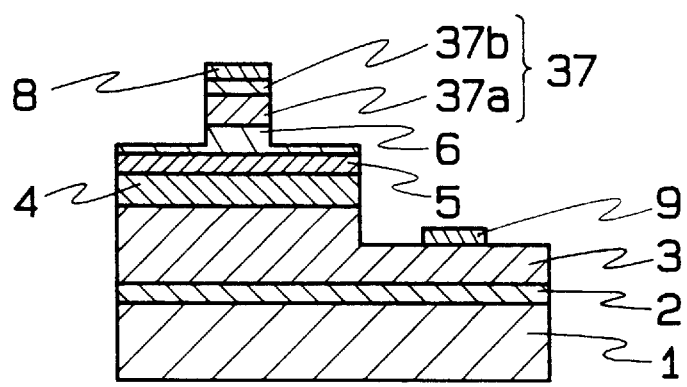
FIG. 7 is an explanatory drawing of a section illustrating an example 3 of the light emitting element of a semiconductor of the present invention.

In a further other example of the semiconductor laser of the present invention shown in FIG. 7, a low temperature buffer layer 2 of approximately 0.01 to 0.2 μm consisting of the n-type GaN and the like on a substrate 1 such as sapphire (single crystal of $Al_2O_3$), a high temperature buffer layer 3 of approximately 2 to 5 μm, a lower cald layer 4 of approximately 0.1 to 0.3 μm consisting of the n-type $Al_kGa_{1-k}N$ (0<k<1), an active layer 5 of approximately 0.05 to 0.1 μm consisting of a non-doping or n-type or p-type $In_yGa_{1-y}N$ (0<y<1) and having smaller band gap energy and larger refractive index that the lower clad layer 4, an upper clad layer 6 of approximately 0.3 to 2 μm which is of the same composition as the lower clad layer 4 and of the p-type, and a contact layer 37 consisting of the p-type GaN layer 37a of approximately 0.3 to 2 μm which is of the same composition as the buffer layers 2 and 3 and of the p-type and the p-type $In_aGa_{1-a}N$ (0<a<1) layer 27b of approximately 0.05 to 0.2 μm provided on the surface thereof are laminated in order, a p-side electrode 8 is provided on the $In_aGa_{1-a}N$ layer 37b of the surface of the contact layer 37, an n-side electrode 9 is provided on the n-type clad layer 4 or the high temperature buffer layer 3 exposed by etching a part of the laminated semiconductor layer, and a chip of the semiconductor laser of this example is formed.

In the semiconductor laser of this example, a semiconductor layer of gallium nitride type compound is laminated, the material of the p-type contact layer 37 to be provided with the p-type electrode 8 has smaller band gap energy than GaN and is difficult for the surface level to occur, for example, the p-type $In_aGa_{1-a}N$ layer 37*b* is provided on the surface of the GaN layer 37*a*, and the p-side electrode 8 is provided on the $In_aGa_{1-a}N$ layer 37*b*. Since lattice mismatching results if In is mixed with GaN, such mixture is not used in a layer except when a material of small band gap energy is indispensable as in the case of the active layer, and there has been no conception at all to use the $In_aGa_{1-a}N$ layer in the contact layer 37. However, in the light emitting element of a semiconductor which uses a semiconductor of gallium nitride type compound, it is not possible to increase the carrier density of the p-type layer above a certain value, and the increase in the contact resistance between the p-type layer and the p-side electrode increased the operating voltage and caused lowered light emitting efficiency. As the reault of assiduous studies, the inventor of the present invention overcome the problem of lattice mismatching by forming the semiconductor layer to a thickness of approximately 0.05 to 0.2 µm in which a film is formed even if a little lattice mismatching should occur, found out that it is possible to lower the contact resistance with metal, and completed the present invention.

In the case where $In_aGa_{1-a}N$ contained with In as the material of small band gap energy is used, if the composition ratio of In is increased, the thickness for example of the foregoing semiconductor was not preferable in that a phenomenon such as occurrence of transition emerged, but by setting the composition ratio a of In to $0<a\leq 0.5$, preferable to $0.05\leq a<0.3$, more preferable to $0.05\leq x\leq 0.2$, it was made possible to reduce the contact resistance with metal without causing the problem transition.

Even in the case where GaAs or Gap was used as the material of small band gap energy instead of $In_aGa_{1-a}N$, it was possible to perform an operation in which the contact resistance with metal was also small, it was also difficult for the surface level to occur on the semiconductor surface, and the operating voltage was low. Growth temperature of GaAs or GaP is different from that of the GaN type layer, but it is possible to obtain a layer by forming the GaN type layer and then by growing it by lowering the temperature inside the MOCVD device to 500° to 800° C. Though lattice mismatching of GaN occurs with respect to GaAs or GaP, but the influence due to lattice mismatching is reduced to certain extent by setting the foregoing thickness to approximately 0.05 to 0.2 µm.

By mixing In further with GaAs or GaP, it is possible to use the characteristic that it is easy to make alloy using a metal which is difficult to be oxidized than Al and Ga, and it was possible to reduce the contact resistance further. In this case, it is possible to increase the composition ratio of In to approximately 0 to 0.5.

Next, referring to FIG. 9(*a*) and FIG. 9(*b*), and by providing a semiconductor of small band gap energy on the surface of the contact layer 37, the principle that the contact resistance with the p-side electrode is reduced will be described.

Figure 9A:
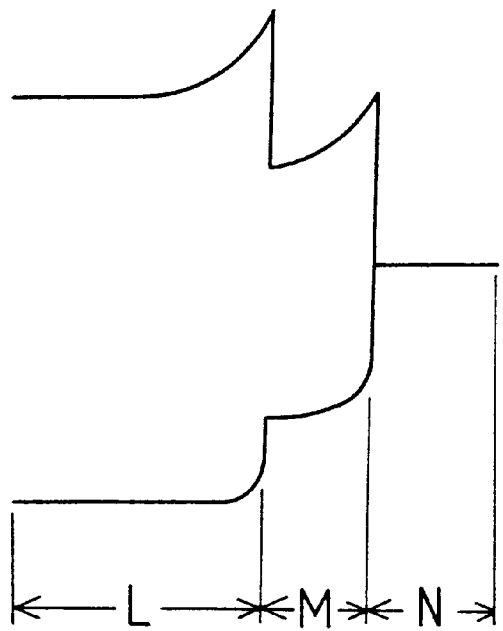
FIGS. 9(a) through 9(b) are explanatory drawings of the energy band of the contact layer and the electrode metal of the light emitting element of a semiconductor of FIG. 7.
Figure 9B:
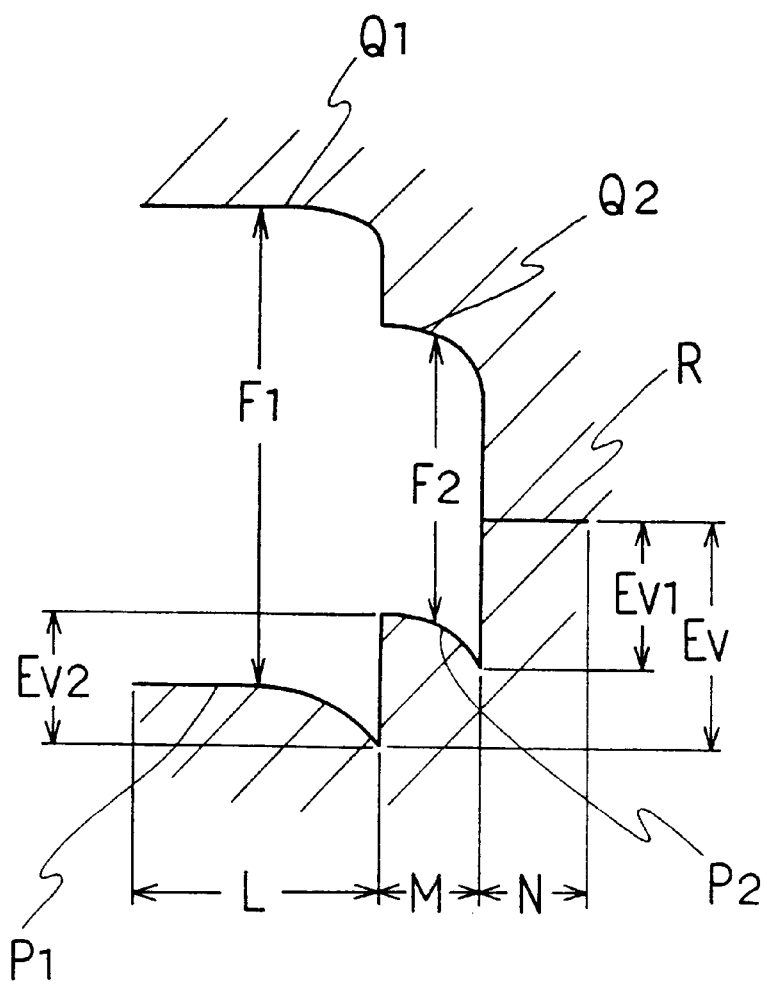

FIG. 9(*a*) and FIG. 9(*b*) are the drawings showing the energy band of the contact layer 37 and the p-side electrode 8, in which the left side of the drawing indicates the side of the p-type clad layer 6 of the contact layer 37, the right thereof indicates the side of the p-side electrode 8, and the letter L represents the energy band of the GaN layer 37*a*, M represent that of the $In_xGa_{1-x}N$, layer 37B, and N represent that of part of the p-side electrode 8 respectively. FIG. 9(*a*) and FIG. 9(*b*) typically illustrate the state where the energy levels move upward and downward on the surface of the GaN layer 37*a* or the $In_aGa_{1-a}N$ layer 37*b* depending on the composition of the semiconductor layer and the kind of the metal for electrode to be provided on the surface of the semiconductor layer, and indicate the same phenomena in any state of FIG. 9(*a*) and FIG. 9(*b*). In FIG. 9(*a*) and FIG. 9 (*b*), $P_1$ and $P_2$ indicate the valence band of GaN and $In_aGa_{1-a}N$ respectively, $Q_1$ and $Q_2$ the conduction band respectively, and R the energy level where the electron of an electrode metal is maximum. The gap $F_1$ of $P_1$ and $Q_1$ and the gap $F_2$ of $P_2$ and $Q_2$ respectively represent the band gap energy (forbidden band) of GaN and $In_aGa_{1-a}N$. The flow of electric current from the p-side electrode to the contact layer means that the positive hole moves from the energy level R of the electrode metal to the valence band $P_1$ of GaN, but in accordance with the present invention, because the $In_aGa_{1-a}N$ layer is provided, it is normal once the positive hole climbs over the gap energy $E_{v1}$ and flows to the valence band $P_2$ of the $In_aGa_{1-a}N$ layer, and then climbs over the gap evergy $E_{v2}$ from $P_2$ to $P_1$ and flows, so that the positive hole flows easily because it is not neecssary for the positive hole to climb over the gap energy $E_v$ at one time when there is no $In_aGa_{1-a}N$. In this case, assuming that the constant of the electric current including the item of the temperature and $k_1$ and $k_2$ respectively, the gap energy can be expressed by $\exp\{-(k_1E_{v1}+k_2E_{v2})\}$. The reason that the energy barrier is devided into two stages is that the forbidden band width $F_2$ of $In_aGa_{1-a}N$ is smaller than the forbidden band width $F_1$ of GaN, and ideally, it is desirable to use the material of the forbidden band width $F_1$ of GaN GaAs or GaP or $In_bGa_{1-b}As$ or $In_bGa_{1-b}P$ has also the same relation of the forbidden band width, and the contact resistance is reduced in the same manner.

Next, referring to FIGS. 8(*a*) through 8(*c*), the manufacturing method of the semiconductor laser of this example shown in FIG. 7 will be described.

Figure 8A:
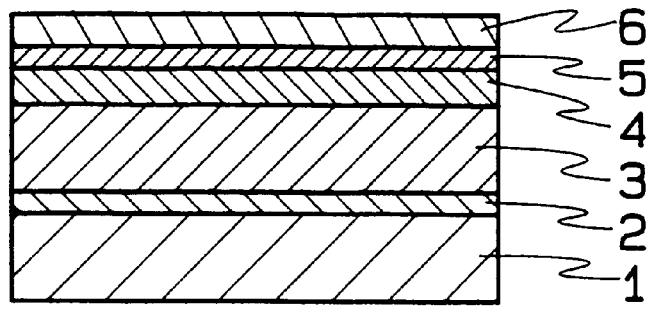
FIGS. 8(a) through 8(c) are drawings illustrating manufacturing methods of the light emitting element of a semiconductor of FIG. 7.
Figure 8B:
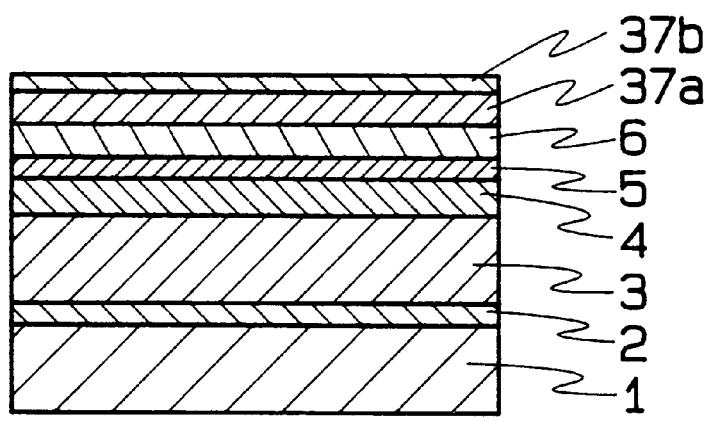

First, as shown in FIG. 8(*a*), to the substrate 1 consisting of sapphire and the like in the same manner as the example 1 is supplied by the MOCVD method the carrier gas $H_2$ together with TMG and $NH_3$ which are the organometallic compound gas, and $SiH_4$ as the dopant, and the low temperature buffer layer 2 and the high temperature buffer layer 3 consisting of gallium nitride type semiconductor layer such as the n-type GaN layer are grown respectively to approximately 0.01 to 0.2 µm and 2 to 5 µm.

Then, TMA is added further to the foregoing gas, and n-type clad layer 4 containing Si and the like of the n-type dopant as the $SiH_4$ gas and the like is formed to approximate thickness of 1 to 2 µm.

Next, as a material in which the band gap energy is smaller than that of the clad layer, in place of the foregoing material gas for example, TMI is introduced and approximately 0.05 to 0.1 µm of an active layer 5 is formed, further, in place of $SiH_4$, the same material gas used for forming the n-type clad layer 4 is used and $Cp_2Mg$ or DMZn is introduced into a reaction tube as the p-type impurity, and the p-type GaN layer which is the p-type clad layer 6 is caused to grow in vapor phase.

Then, as shown in FIG. 8(*b*), in order to form a contact layer, $Cp_2Mg$ or DMZn is supplied as the dopant gas using the same gas of the foregoing buffer layer 3, and the p-type GaN layer 37*a* is grown to a thickness of approximately 0.3 to 2 µm.

Further, in order to reduce the contact resistance with the p-side electrode, TMI is added to the same material gas as the foregoing GaN layer 37*a*, and the $In_aGa_{1-a}N$ (0<a<1, where a=0.1 for example) is formed to a thickness of approximately 0.05 to 0.2 µm. If the $In_aGa_{1-a}N$ layer is excessively thick, the resistance of the film itself influences the entire layer, and if it is excessively thin, the contact resistance cannot be reduced.

In the foregoing description, the p-type $In_aGa_{1-a}N$ layer is used as part of the contact layer, but by changing the gas to the p-type $In_aGa_{1-a}N$, it is possible to obtain the same effect by forming the p-type GaAs, p-type GaP, p-type $In_bGa_{1-b}As$ (0<b<1, where b=0.2 for example) or p-type $In_bGa_{1-b}P$ (0<b<1, where b=0.5 for example) as the contact layer on the side contacting the p-side electrode. In this case, it is possible to obtain the same effect by lowering the inside temperature of the MOCVD device to 500° to 800° C. and introducing the gas, in place of the foregoing TMI, or introducing TMI and tertiary butyl arsine (TBA) or tertiary butyl phosphine (TBP).

Afterwards, a protective film such as $SiO_2$ and $Si_3N_4$ is provided over the entire surface of the grown layer of a semiconductor, annealing or electron irradiation is provided for approximately 20 to 60 minutes at 400° to 800° C. so as to activate the p-type clad layer 6 and the contact layer 37. Upon completion of annealing, the protective film is removed by wet etching.

Figure 8C:
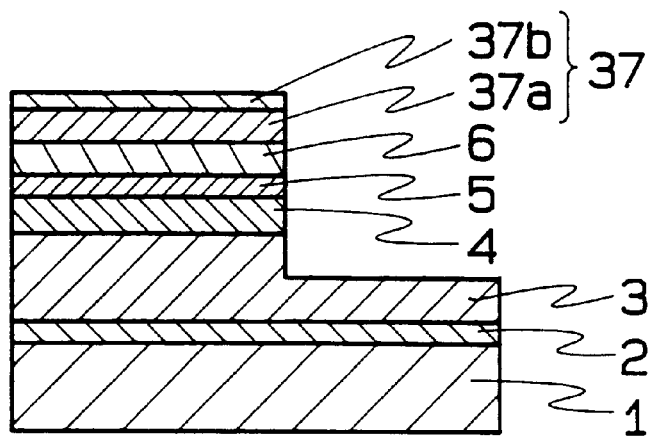

Then, in order to form an electrode on the n-side, resist is applied and patterning is provided, a resist film is provided on the surface of a semiconductor layer of gallium nitride type compound from which the protective film is removed as shown in FIG. 8(c), part of the semiconductor layer is removed by dry etching, the high temperature buffer layer 3 which is an n-type layer or the n-type clad layer 4 is exposed, on the surface of the exposed high temperature buffer layer 3 (or the n-type clad layer 4) is formed an n-side electrode 9 consisting of Al and the like to be electrically connected to the n-type layer, and on the surface of the contact layer 37 of a semiconductor layer of the laminated compound is formed a p-side electrode 8 consisting of a metallic film such as Au and Zn respectively by sputtering and the like. Next, part of the contact layer 7 and the p-type clad layer is turned into the mesa-type shape by etching, and a semiconductor laser chip is formed by dicing each chip.

And, a structure for lowering the contact resistance between the p-side electrode 8 and the contact layer 37 of this example can be applied to the light emitting element of various semiconductors such as an LED of double hetero junction or an LED of pn junction.

In accordance with the light emitting element of the semiconductor of the example 3, because the portion at least contacting the p-side electrode of the contact layer of the p-side electrode is formed with a semiconductor material having smaller band gap energy than the p-type GaN, it is possible to reduce the influence of the surface level and it is also possible to reduce the contact resistance with the p-side electrode. Therefore, it is possible to reduce the operating voltage and improve the light emitting efficiency.

EXAMPLE 4

In the light emitting element of the semiconductor of the example, when forming a semiconductor of gallium nitride type compound on a substrate such as sapphire, a semiconductor layer in which In, P or As is contained is provided on a semiconductor layer at least contacting a substrate, the strain of such semiconductor layer is relieved so as to restrict occurrence of crystal defects or transition involved in lattice mismatching with a substrate such as sapphire, thereby preventing the progress of crystal defects or transition toward the semiconductor layer which contributes to the light emitting portion.

A semiconductor layer containing In is one of which part of GaN is replaced by In and by forming on the substrate as a semiconductor layer of $In_cGa_{1-c}N$ (0<c<1), In becomes heavier than Ga and is moved easily, so that it is possible to form a soft buffer layer with less strain in which coupling between atoms is easily cut. The composition ratio c of In is set to 0 to 1, and preferable to 0.1 to 0.5, and more preferably to approximately 0.1 to 0.3. If the composition ratio of In is excessively large, the difference between the substrate and the lattice constant becomes excessively large, posing excessively large problem of lattice mismatching, and therefore, the effect of relieving the strain by In is now shown if the composition ratio of In is excessively small. In this $In_cGa_{1-c}N$ the same applies to the case of $In_cAl_eGa_{1-d-e}N$ (0<d<1, 0<e<1, 0<d+e<1) in which part of Ga is replaced further by Al.

And, in a semiconductor layer containing p or As, part of N of GaN is replaced by P or As and formed on a substrate as $GaN_wP_{1-w}$ (0<w<1) or $GaN_vAs_{1-v}$ (0<v<1), because p or As is heavier than N and is moved easily, so that it is possible to form a soft buffer layer with less strain in which coupling between atoms is easily cut. Composition ratio w and V of P and As is set to 0<w and $v \leq 0.2$, preferably to 0<w and $v \leq 0.1$, and more preferably to approximately $0.02 \leq w$ and $v \leq 0.06$. When the composition ratio of P and As becomes excessively large, lattice mismatching between GaN and N becomes large, and therefore, the effect of relieving the strain is low shown if the composition ratio of P and As is excessively small.

In P and As, both atoms may be contained not only in one side only but may be contained in to form of mixed crystals. In this case, it is preferable that the total composition ratio of P and As is contained in the range of the foregoing w or v. Further, each atom such as In and P, In and As, and In and As may form a mixed crystal respectively. In this case, it is possible to contain in the range of the foregoing c and to contain P and/or As in the range of foregoing w or v.

Next, further details will be described in concrete example.

FIGS. 10(a) through 10(d) are explanatory drawings of a section of the process of the concrete example of the light emitting element of a semiconductor of the example 4.

Figure 10A:
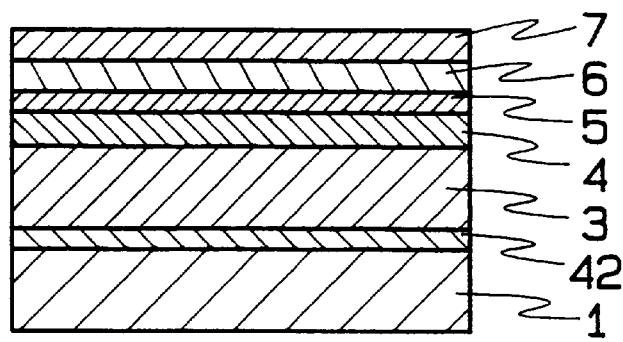
FIGS. 10(a) through 10(d) are explanatory drawings illustrating manufacturing processes of the example 4 of the light emitting element of a semiconductor of the present invention.
Figure 10B:
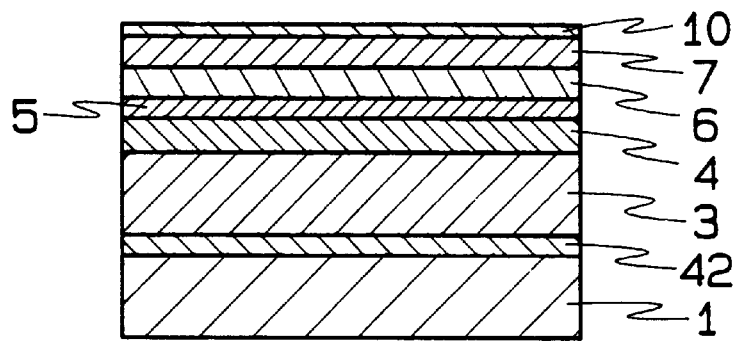

First, as shown in FIG. 10(a), to a substrate 1 consisting of sapphire and the like is supplied by the MOCVD method the carrier gas, TMG, $NH_3$, and TMI, a low temperature buffer layre 42 consisting of a semiconductor layer of the n-type gallium nitride type compound of $In_cGa_{1-c}N$ (0<c<1, where c=0.2 for example) is formed to approximate thickness of 0.01 to 0.2 μm at low temperature of 400° to 600° C . Composition ratio of In is set preferably to 0.1 to 0.5, sand more preferably to 0.1 to 0.3. If the composition ratio is excessively large, the problem of lattice mismatching results and if excessively small, the effect of relieving the strain is not shown.

Afterwards, in order to form a buffer layer of single crystal, temperature is at 700° to 1200° C. and the low temperature buffer layer is made into a single crystal layer, and on the surface thereof is grown the high temperature buffer layer 3 consisting of GaN or AlGaN type or InAlGaN type and the like to approximate thickness of 2 to 5 μm. Afterwards, a clad layer 4 consisting, for example, of the n-type $Al_kGa_{1-k}N$ (0<k<1) and active layer 5 consisting of $In_yGa_{1-y}N$ (0<y<0.2) is grown to approximate thickness 0.1 to 0.3 μm and 0.05 to 0.1 μm respectively. To form the clad layer, TMG, NH and TMA, and $SiH_4$ as the dopant are supplied, and TMI is introduced in place of TMA and caused to react.

Further, with the same material gas as the material gas used for forming the n-type clad layer 4, impurity material gas is replaced by $SiH_4$, $Cp_2Mg$ or DMZn gas is introduced into a reaction tube as the p-type impurity material gas, so that the p-type $Al_kGa_{1-k}N$ (0<k<1) layer which is the p-type clad layer 6 is caused to grow in vapor phase.

Then, a contact layer (cap layer) 7 consisting, for example, of the p-type GaN layer is grown and formed to 0.2 to 3 μm.

Figure 10C:
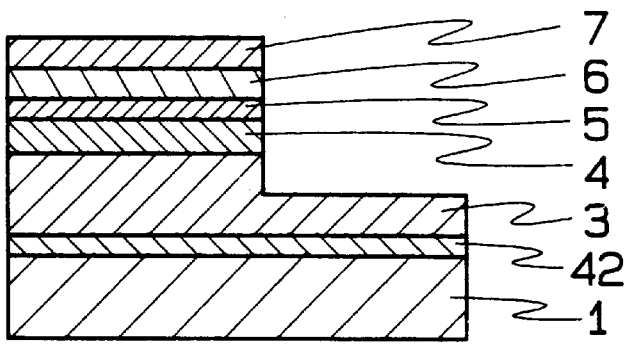

Afterwards, as shown in FIG. 10(c) in the same manner as the example 1, a protective film 10a such as $SiO_2$ and $Si_3N_4$ is provided on the entire surface of the grown layer of a semiconductor layer, annealing or electron irradiation is provided for approximately 20 to 60 minutes at 400° to 800° C., thereby activating the p-type clad layer 6 and the contact layer 7.

Figure 10D:
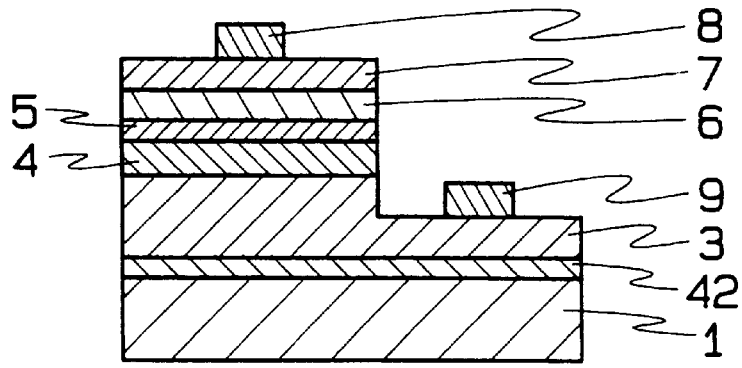
Figure 11:
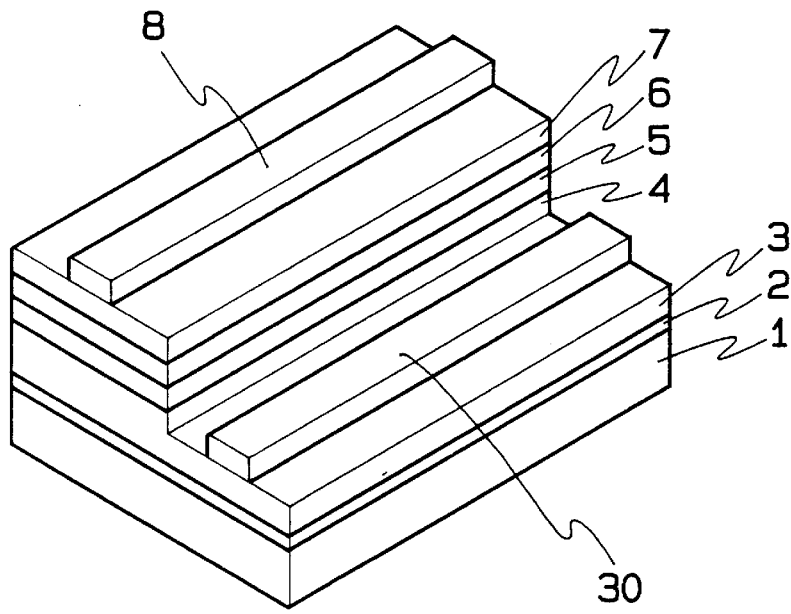
FIG. 11 is a perspective drawing illustrating an example of a conventional light emitting element of a semiconductor and FIG. 12 is an explanatory drawing of a section of a conventional semiconductor of GaAs type compound.
Figure 12:
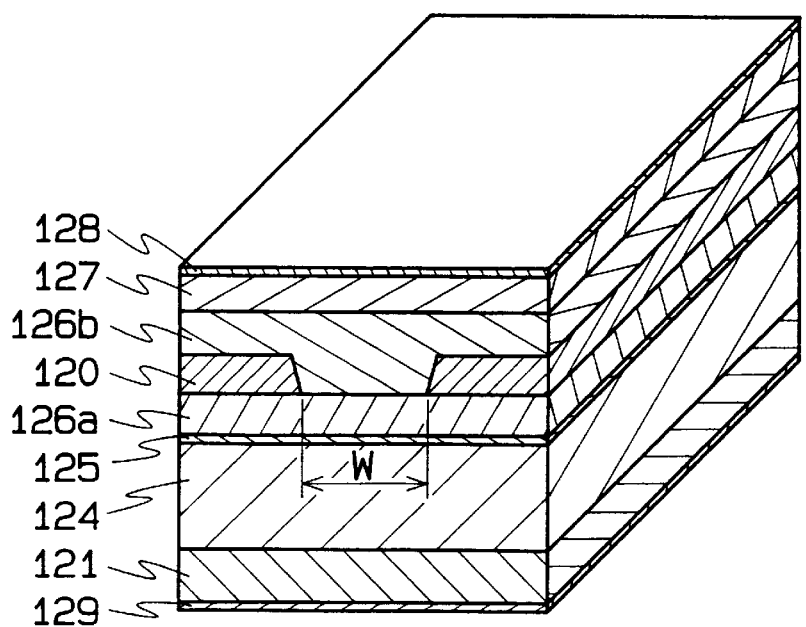

Then, in order to form an electrode of the n-side after the protective film 10a is removed, resist is applied and patterning provided, a clad layer 4 or buffer layer 3 which are the n-type layer are exposed (refer to FIG. 10(c)) by removing part of each of grown semiconductor layer by etching in the same manner as the example 1, the n-side electrode 9 to be electrically connected to the n-type layer and the p-side eletrode 8 to be electrically connected to the p-type contact layer 7 are respectively formed on the surface of a semiconductor layer of the laminated comopund by sputtering and the like (refer to FIG. 10(d)), and LED chips are formed by dicing.

In accordance with this example, because a semiconductor layer of gallium nitride type compound containing In is used for the low temperature buffer layer 42 as the semiconductor layer which contacts a substrate such as sapphire, the semiconductor becomes one which is soft and the coupling thereof between atoms is easily cut, and it is possible to considerably relieve the strain involved in lattice mismatching. The low temperature buffer layer 42 may not be have to be $In_cGa_{1-c}N$ but the same result was obtained by $In_dAl_eGa_{1-d-e}N$.

With respect to the material gas used for forming the foregoing low temperature buffer layer 42, in place of TMI, tertiary butyl phosphine (TBP) or tertiary butyl arsine (TBA), for example, is introduced, a semiconductor layer of a compound consisting of $GaN_wP_{1-w}$ (0<w<1) or $GaN_vAs_{1-v}$ (0<v<1) is formed, and the same structure and manufacturing method were used as in the case of $In_cGa_{1-c}N$. The growth temperature of the low temperature buffer layer 24 was 400° to 600° C.

As a result, because a semiconductor of gallium nitride type compound containing P or As is used for the low temperature buffer layer as a semiconductor layer which contacts a substrate such as sapphire, as in the case of the example 1 in which such semiconductor contained In, it is possible to obtain a soft semiconductor layer with coupling thereof between atoms being easily cut, and to considerably relieve the strain involved in the lattice mismatching.

In each of the foregoing example, examples of LED of double hetero junction were described, but it is the same with a laser diode of pn junction various structures.

In accordance with the light emitting element of the semiconductor of the example 4, because a low temperature buffer layer consisting of a semiconductor containing at least In, P or As is provided as a semiconductor of gallium nitride type compound to be formed on the surface of substrate, the semiconductor is soft and the strain is relieved. As a result, occurrence of crystal defects and transition in the low temperature buffer layer is restricted, progress of crystal defects or transition toward the semiconductor which contributes to emission of light can also be restricted, thereby improving the light emitting characteristic, improving reliability, and extending the life further.

EXAMPLE 5

In the light emitting element of the semiconductor of this example 5, a buffer layer which is a semiconductor layer contacting a substrate of a semiconductor layer of gallium nitride type compound containing at least an n-type layer and a p-type layer to be laminated to form a light emitting portion on a substrate such as sapphire is composed by a semiconductor in which it is difficult for electric current to flow. In other words, because the lattice constant of the semiconductor layer of gallium nitride type compound and that of the sapphire substrate are different in that the former is 4.758 Å and the latter is 3.189 Å, strain due to lattice mismatching occurs in the buffer larer on the substrate, and crystal defects or transition are likely to occur. When electric current flows into the semiconductor where such crystal defects or transition are occurring, heat is generated and crystal defects or transition increase in the portion where cyrstal defects or transition occur. Because the crystal defects or transition occurred in this buffer layer progress toward the semiconductor layer which forms the light emitting portion, by preventing electric current form flowing to the buffer layer on the substrate as much as possible, it is possible to restrict the occurrence of crystal defects or transition in the entire semiconductor layer.

In order to make the buffer layer portion contacting the substrate as a layer where electric current is difficult to flow, it is possible to obtain such layer by making the layer as a high resistance layer or a layer of opposite conduction type by introducing a semiconductor layer of the upper part of the buffer layer and opposite conduction type dopant when growing a semiconductor layer in vapor phase. For example, because it is necessary to anneal and activate the p-type layer when forming the light emitting element a semiconductor by laminating a semicondcutor of gallium type compound, the lower portion which is the substrate side is made into an n-type layer and the surface side is made into a p-type layer, and then are laminated. When growing a semicondcutor of gallium nitride type compound in vapor phase, N of the semiconductor of gallium nitride type compound is easily evaporated, so that the n-type layer is obtained without mixing a dopant. Therefore, when forming a buffer layer, by mixing the n-type clad layer to be formed on the buffer layer and the p-type dopant of opposite conduction type, the layer to be originally formed into an n-type layer is neutralized by the p-type dopant and becomes a high resistance layer, and becomes a p-type layer by mixing more p-type dopant. Because the n-side electrode is provided on the surface of the n-type layer of the buffer layer or the clad layer, electric current does not flow to the high resistance layer of the substrate side or to the p-type layer. As a result, electric current does not flow to the buffer layer of the substrate side in particular where crystal defects or transition are likely to occur, so that it is possible to prevent an increase of crystal defects or transition When a semiconductor of gallium nitride type compound containing at least either In, P or As is used for the foregoing buffer layer, In is heavier than Ga and p or As is heavier than N, it is preferable that it is easy to relieve the strain because the coupling between atoms is easily split, and it is further possible to prevent an increase of crystal defects or transition.

Next, the manufacturing method of the light emitting element of the semiconductor of the example 5.

First, as shown in FIG. 10(a) of the example 4, on a substrate 1 consisting of sapphire and the like is supplied by the MOCVD method the carrier gas $H_2$ together TMG at the flow rate of 20 to 200 sccm, $NH_3$, at the flow rate 5 to 20 slm, and $Cp_2Mg$ or DMZn at the flow rate of 10 to 1000 sccm so as to grow in vapor phase at 400 to 700° C., and a low temperature buffer layer 42 consisting of GaN having the specific resistance of approximately 10 to $10^{18}$·cm is grown to approximate thickness of 0.01 to 0.2 μm.

Then, the temperature is raised to approximately 700° to 1200° C. to make the foregoing low temperature buffer layer 42 into single crystal, and the same material gas as the foregoing gas is continuously supplied, the dopant gas is changed to $SiH_4$ and the high temperature buffer layer 3 consisting of the n-type GaN is formed to approximate thickness of 2 to 5 μm. When growing the high temperature buffer layer 3, it is possible to obtain the n-type layer as described above even if the layer is grown without supplying the dopant gas, it is preferable to supply the dopant gas in order to sufficiently increase the carrier gas density.

Afterwards, in the same manner as the example 4, semiconductors of the n-type clad layer, active layer, p-type clad layer, and contact layer are laminated, annealed, and etched to be formed into the p-side electrode and the n-side electrode, and then made into chips.

In this example, the flow rate of the p-type dopant supplied during growth of the low temperature buffer layer 42 is set to approximately 10 to 100 sccm and the buffer layer is formed as a high resistance layer having the specific resistance of approximately 1000 to $10^{18}$·cm, but by setting the flow rate of the p-type dopant to approximately 500 to 1000 sccm and forming the layer as the p-type layer, the high temperature buffer layer 3 thereon is the n-type and the n-side electride is provided on the n-type layer, therefore, little electric current flows to the p-type layer on the insulated substrate, and it is possible to form a layer where electric current is difficult to flow.

In addition, in this example, the entire high temperature buffer layer 3 on the low temperature buffer layer 42 is formed by the example of the n-type layer, but it is also possible to make the lower layer side of the high temperature buffer layer 3 as the high resistance layer or the p-type layer. In this case, by changing only the dopant gas to be supplied while growing a semiconductor layer in vapor phase, it is possible to change the conduction type dopant. Further, the entire of the high temperature buffer layer 3 may be made a high resistance layer or a p-type layer and the n-type clad layer may be made to a thickness to an extent where the series resistance does not pose a problem.

Further, in the light emitting element of a semiconductor which uses a semiconductor of gallium nitride type compound, as stated above, normally the n-type layer is formed n the lower layer side close to the substrate and p-type layer is formed on the surface side, but even if the n-type layer and the p-type layer are formed in the opposite way, it is possible to form a layer where the same electric current is difficult to flow by simply reversing the n-type layer and the p-type layer.

In addition, in this example and LED of double hetero juction is described, the present invention can be applied to the light emitting element of semiconductor such as laser diode having LED of pn junction or various structures.

In accordance with the light emitting element of the semiconductor of the example 5, because the semiconductor layer of gallium nitride type compound (buffer layer) contacting the substrate where crystal defects or transition are likely to occur due to the lattice mismatching is made a layer where electric current is difficult to flow, it is possible to prevent an increase of crystal defects or transition caused by electric current. As a result, it is possible to restrict the occurrnce of crystal defects or transition in the semiconductor layer composing the light emitting portion, and it is possible to obtain the light emitting element of semiconductor having excellent light emitting characteristic.

Further, crystal defects or transition do not increase during operation due to the influence of electric current, while the reliability is improved and the life is extended as well.

In each example of the foregoing examples 1 through 5, examples of semiconductor layers of special compositions are described as the semiconductor layer of gallium nitride type compound, but not limiting to the material of the foregoing composition, the semiconductor layer is generally consisted of $Al_pGa_{1-p-q}N$ ($0 \leq p<1$, $0<q \leq 1$, $0<p+q \leq 1$), the ratio of each composition may be selected so that the bond gap energy of the active layer, for example, is smaller than the band gap energy of the clad layer, or the composition ratios p and q may be changed so as to satisfy the band gap energy or the refractive index of each semiconductor layer according to the desired light emitting element of semiconductor. The present invention can be applied in the same manner as to the material in which part or whole of N of the foregoing $Al_pGa_{1-p-q}N$ is replaced by As and/or P.

What is claimed is:

1. A semiconductor laser of double hetero junction structure comprising:

an active layer;

an n-type layer and a p-type layer, sandwiching said active layer, a band gap energy of said n-type layer and said p-type layer being larger than that of said active layer and a refractive index of said n-type layer and said p-type layer being smaller than that of said active layer;

wherein said n-type and p-type layers comprises at least two layers, respectively; wherein in said active layer side of said n-type and p-type layers is provided a low refractive index layer formed of a material of small refractive index, in other portion of the electric current path of said n-type layer and p-type layer is provided a low resistance layer having smaller electric resistance than that of said low refractice index layer.

2. The semiconductor laser according to claim 1, wherein the thickness of said low refractive index layer is 10 to 50% with respect to the thickness of said n-type layer or p-type layer.

3. The semiconductor laser according to claim 1, wherein the thickness of said low refractive index layer is 0.05 to 0.3 μm.

4. The semiconductor laser according to the claim 1, wherein said active layer consists of $Al_mGa_nIn_{1-m-n}N$ ($0 \leq m<1, 0<n<1, 0<m+n<1$), said low refractive index layer comprising $Al_rGa_sIn_{1-r-s}N$ ($0<r<1, 0<s<1, m+n<r+s \leq 1$, m<r), and said low resistance layer comprising $Al_tGa_uIn_{1-t-u}N$ ($0 \leq t<1, 0<u \leq 1, 0<t+u \leq 1, m \leq t<r, m+n<t+u \leq r+s$).

5. The semiconductor laser according to claim 4, wherein m=0 in the material composition of said active layer, r+s=1 in the material composition of said low refractive index layer, and t=o and u=1 in the material composition of said low resistance layer.

6. A semiconductor light emitting device comprising:

a substrate; and

GaN-type compound semiconductor layers stacked on the substrate, the GaN-type layers including at least one active layer, at least one n-type layer, and at least one p-type layer;

wherein a band gap energy of the one n-type layer is smaller than a band gap energy of the one p-type layer.

7. The semiconductor light emitting device of claim 6, wherein a band gap energy of the active layer is smaller than a band gap energy of each of the one n-type layer and the one p-type layer.

8. The semiconductor light emitting device of claim 7, wherein a difference between the band gap energies of the one n-type layer and the one active layer is not more than ½ of a difference between the band gap energies of the one p-type layer and the active layer.

9. The semiconductor light emitting device of claim 8, wherein the difference between the band gap energies of the one n-type layer and the active layer is in a range of ⅓ to ½ of the difference between the band gap energies of the one p-type layer and the active layer.

10. A semiconductor light emitting device of GaN-type compound comprising:
   an active portion located between a p-type portion and an n-type portion;
   wherein a maximum band gap energy of the n-type portion is smaller than a maximum band gap energy of the p-type portion.

11. The semiconductor light emitting device of claim 10, wherein one of the p-type portion includes $Al_xGa_{1-x}N$ ($0<x<1$).

12. The semiconductor light emitting device of claim 10, wherein the device is one of a light emitting diode and a laser diode.

13. The semiconductor light emitting device of claim 10, wherein a minimum band gap energy of the active portion is smaller than each of the maximum band gap energy of the p-type portion and the maximum band gap energy of the n-type portion.

14. The semiconductor light emitting device of claim 13, wherein a difference between the maximum band gap energy of the n-type portion and a minimum band gap energy of the active portion is not more than ½ of a difference between the maximum band gap energy of the p-type portion and the minimum band gap energy of the active portion.

15. The semiconductor light emitting device of claim 14, wherein the difference between the maximum band gap energy of the n-type portion and the minimum band gap energy of the active portion is in a range of ⅓ to ½ of a difference between the maximum band gap energy of the p-type portion and the minimum band gap energy of the active portion.

16. The semiconductor light emitting device of claim 10, further including:
   a buffer portion located between a substrate and one of the n-type and p-type portions.

17. A GaN-type semiconductor light emitting device comprising:
   an active portion located between a p-type portion and an n-type portion, the active portion emitting light by confining an electron and a positive hole, the electron having a difficulty of escaping from the active portion to the p-type portion based on an effective mass of the electron, the positive hole having a difficulty of escaping from the active portion to the n-type portion based on an effective mass of the positive hole,
   wherein a characteristic of one of the p-type portion and the n-type portion is adjusted such that the difficulty of the electron of escaping from the active portion is similar to the difficulty of the positive hole escaping from the active portion.

18. The semiconductor light emitting device of claim 17, wherein the characteristic is a band gap energy.

19. A semiconductor light emitting diode comprising:
   an active portion located between a p-type portion and an n-type portion, the active portion having a minimum band gap energy smaller than each of a maximum band gap energy of the p-type portion and the n-type portion,
   wherein the maximum band gap energy of the n-type portion is smaller than the maximum band gap energy of the p-type portion.

20. The semiconductor light emitting diode of claim 19, wherein one of the p-type portion includes $Al_xGa_{1-x}N$ ($0<x<1$).

21. The semiconductor light emitting diode of claim 20, wherein a difference between the maximum band gap energy of the n-side portion and the minimum band gap energy of the active portion is not more than ½ of a difference between the maximum band gap energy of the p-type portion and the minimum band gap energy of the active portion.

22. The semiconductor light emitting diode of claim 21, wherein the difference between the maximum band gap energy of the n-side portion and the minimum band gap energy of the active portion is in a range of ⅓ to ½ of a difference between the maximum band gap energy of the p-type portion and the minimum band gap energy of the active portion.

23. The semiconductor light emitting diode of claim 10, further including:
   a buffer portion located between a substrate and one of the n-type and p-type portions, the buffer portion including GaN.

* * * * *

UNITED STATES PATENT AND TRADEMARK OFFICE
CERTIFICATE OF CORRECTION

PATENT NO.   : 6,115,399
DATED        : September 5, 2000
INVENTOR(S)  : Yukio Shakuda It is certified that error appears in the above-identified patent and that said Letters Patent is hereby corrected as shown below:

Column 24, claim 1,
Line 38, change "said" to -- an --;
Line 41, change "other" to -- another --; and change "the" to -- an --;
Line 44, change "refractice" to -- refractive --.

Column 25, claim 11,
Line 25, after "portion" insert -- and the n-type portion --.

Column 26, claim 20,
Line 29, after "portion" insert -- and the n-type portion --.

Column 26, claim 21,
Line 33, change "n-side" to -- n-type --.

Column 26, claim 22,
Line 39, change "n-side" to -- n-type --; and
Line 40, change "a" (second occurrence) to -- the --.

Signed and Sealed this

Twentieth Day of November, 2001

*Attest:*

Nicholas P. Godici

*Attesting Officer*

NICHOLAS P. GODICI
*Acting Director of the United States Patent and Trademark Office*